(12) United States Patent
Tews et al.

(10) Patent No.: US 7,777,300 B2
(45) Date of Patent: Aug. 17, 2010

(54) SEMICONDUCTOR DEVICE WITH CAPACITOR

(75) Inventors: Helmut Tews, Munich (DE);
Hans-Gerd Jetten, Hoehenkirchen (DE); Alexander von Glasow, Deisenhofen (DE); Hans-Joachim Barth, Munich (DE)

(73) Assignee: Infineon Technologies AG, Neubiberg (DE)

( * ) Notice: Subject to any disclaimer, the term of this patent is extended or adjusted under 35 U.S.C. 154(b) by 136 days.

(21) Appl. No.: 11/856,775

(22) Filed: Sep. 18, 2007

(65) Prior Publication Data
US 2009/0073633 A1    Mar. 19, 2009

(51) Int. Cl.
*H01L 23/52* (2006.01)
(52) U.S. Cl. ........................ 257/532; 257/693; 257/758; 257/779; 257/E23.144

(58) Field of Classification Search .................. 257/694, 257/695
See application file for complete search history.

(56) References Cited

U.S. PATENT DOCUMENTS

| | | | |
|---|---|---|---|
| 2006/0022311 A1* | 2/2006 | Lin .............................. | 257/649 |
| 2006/0267179 A1* | 11/2006 | Gross .......................... | 257/700 |
| 2007/0096313 A1* | 5/2007 | Chou et al. .................. | 257/737 |
| 2008/0006945 A1* | 1/2008 | Lin et al. ..................... | 257/758 |
| 2008/0157316 A1* | 7/2008 | Yang ........................... | 257/685 |

* cited by examiner

*Primary Examiner*—Stephen W Smoot
(74) *Attorney, Agent, or Firm*—Philip H. Schlazer

(57) ABSTRACT

One or more embodiments are related to a semiconductor structure, comprising: a semiconductor chip having a final metal layer; a dielectric layer disposed over the final metal layer; and a conductive layer deposed over the dielectric layer, the dielectric layer being between the final metal layer and the conductive layer.

52 Claims, 17 Drawing Sheets

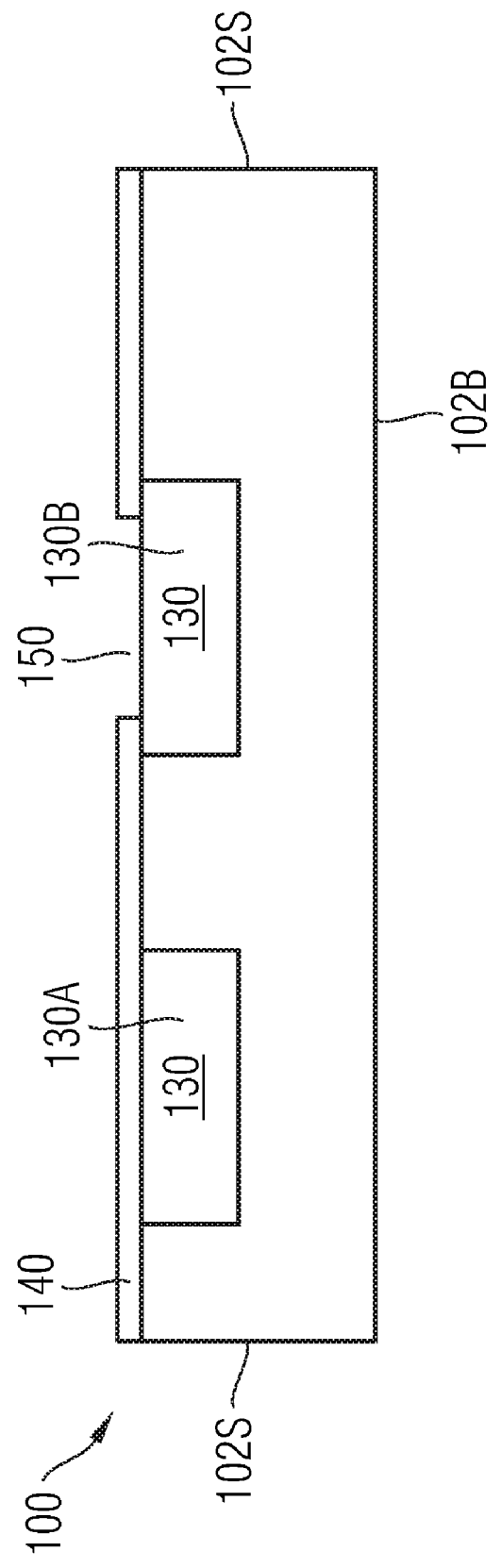

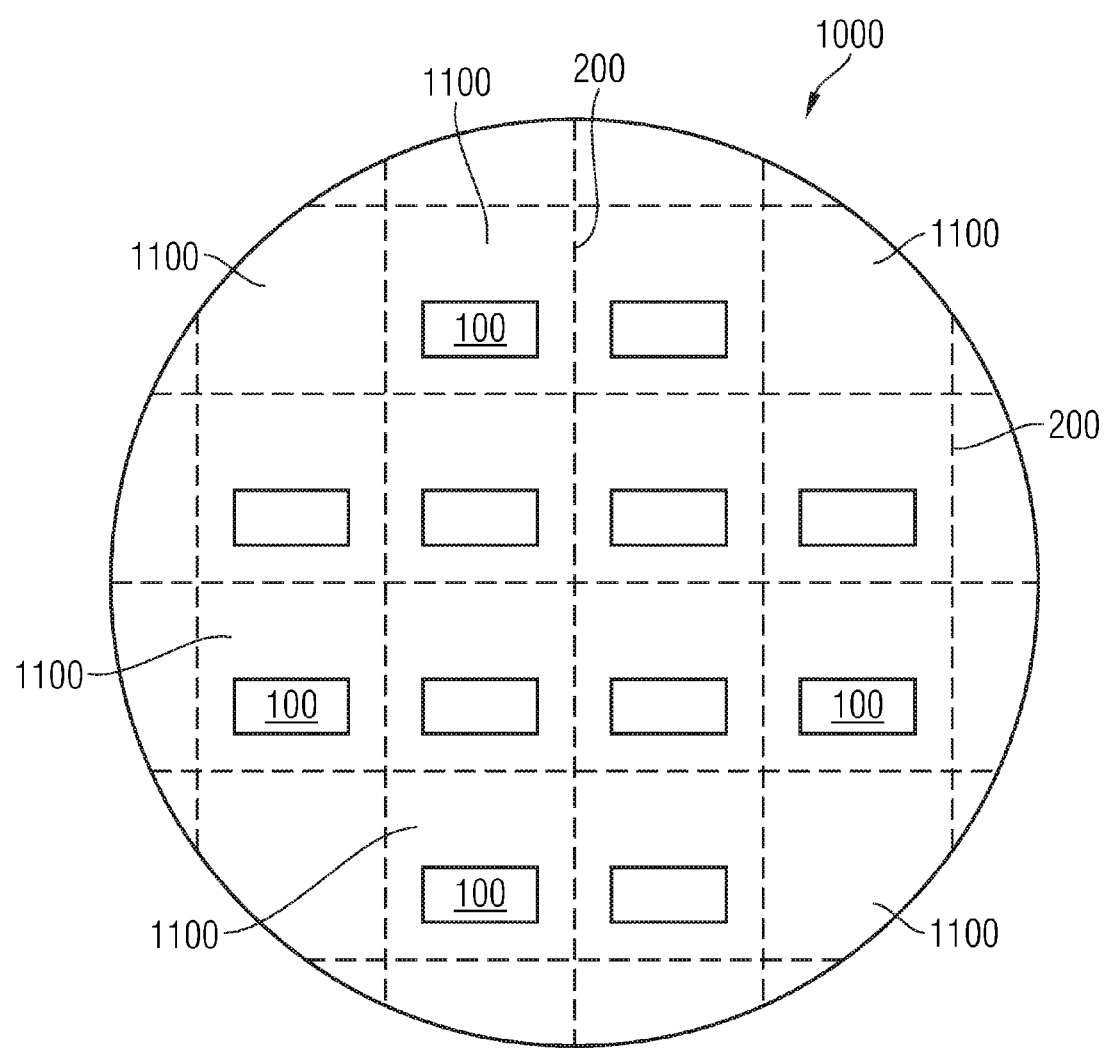

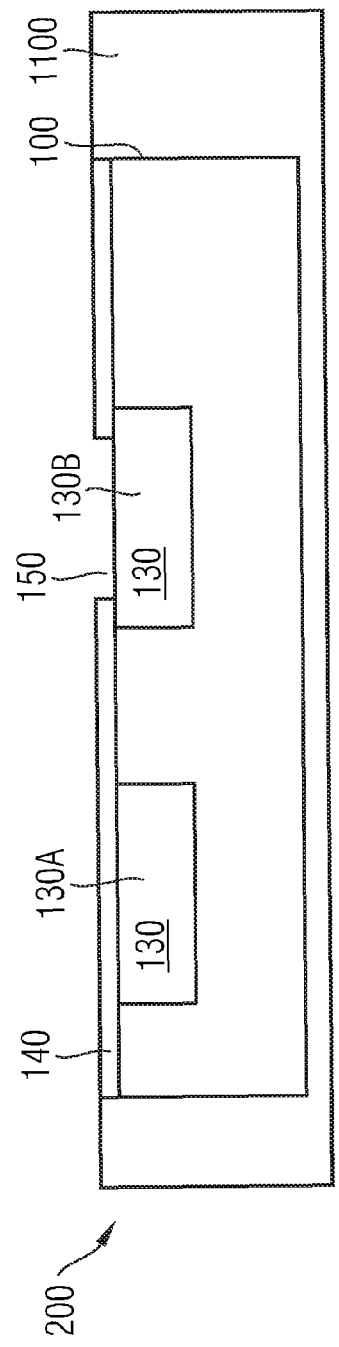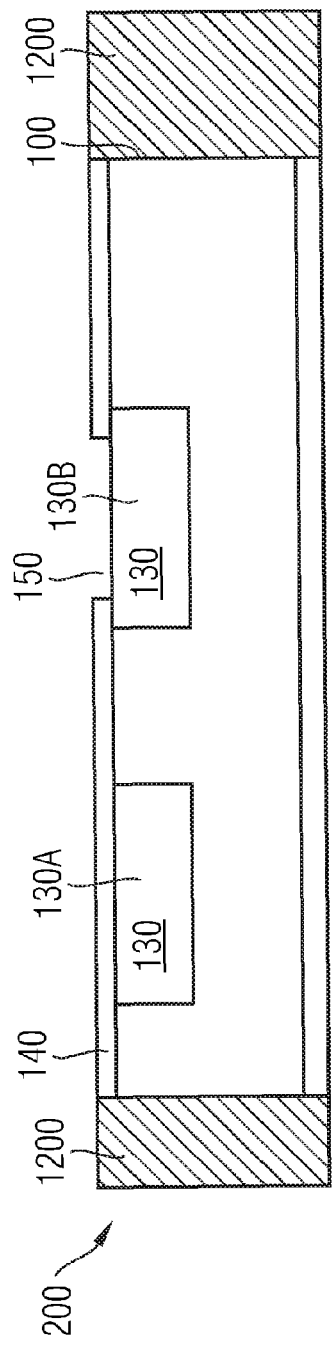

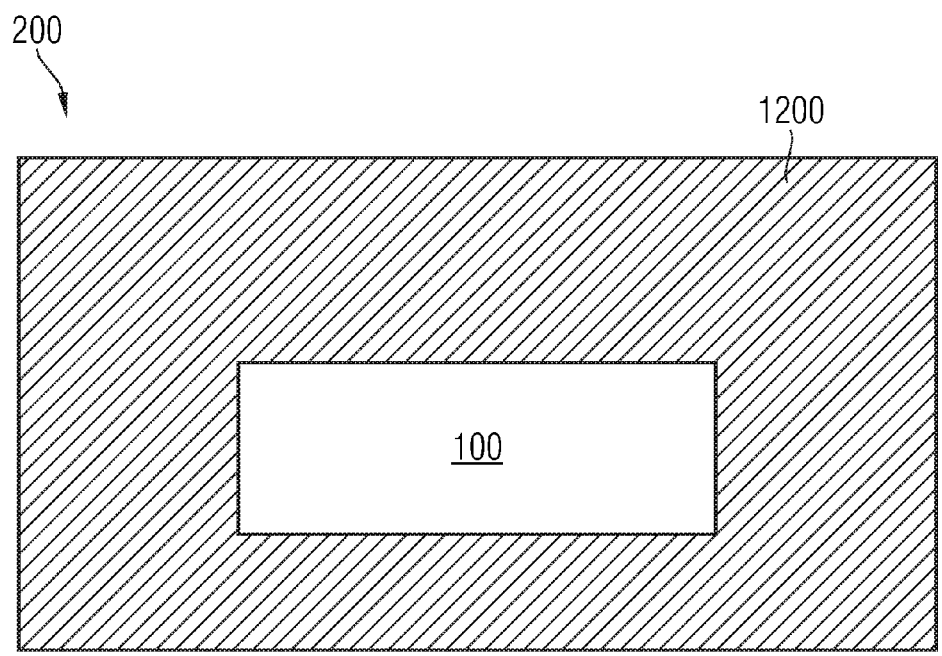

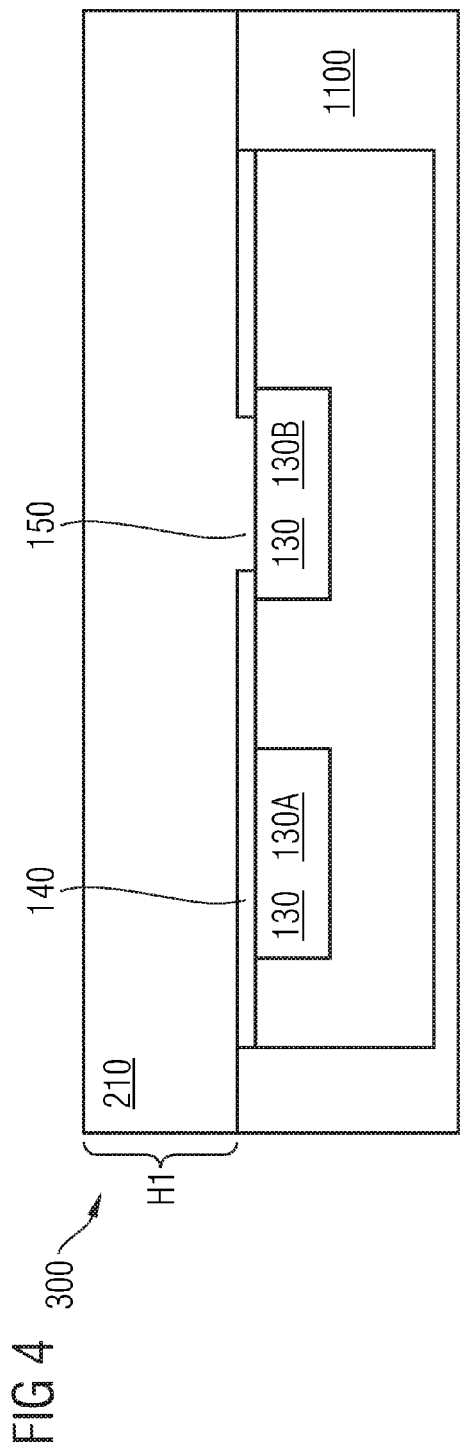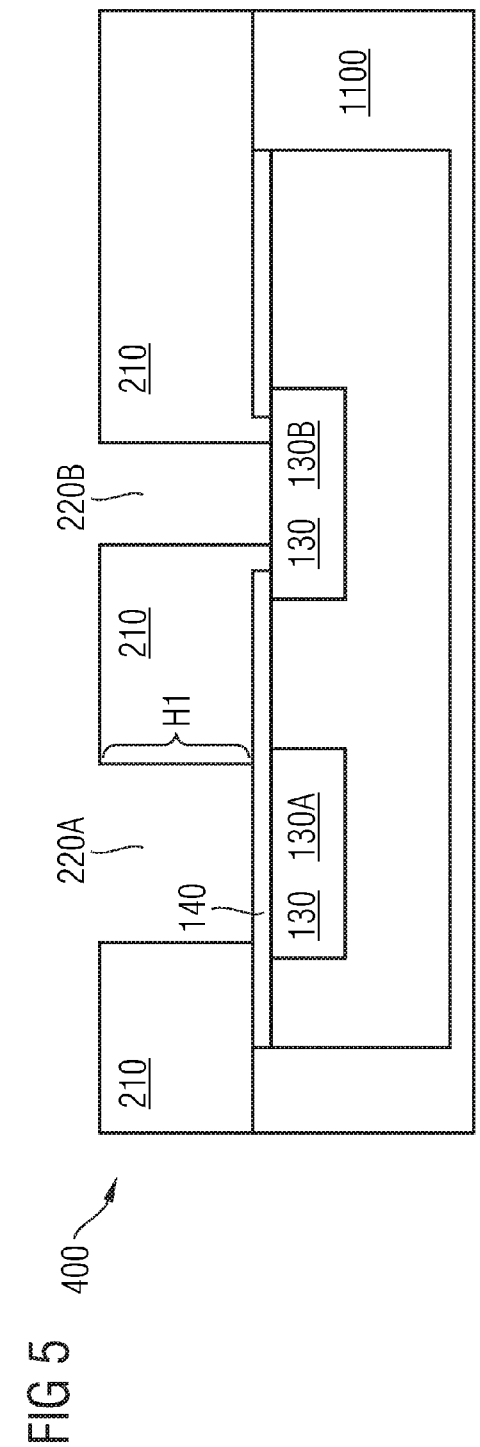

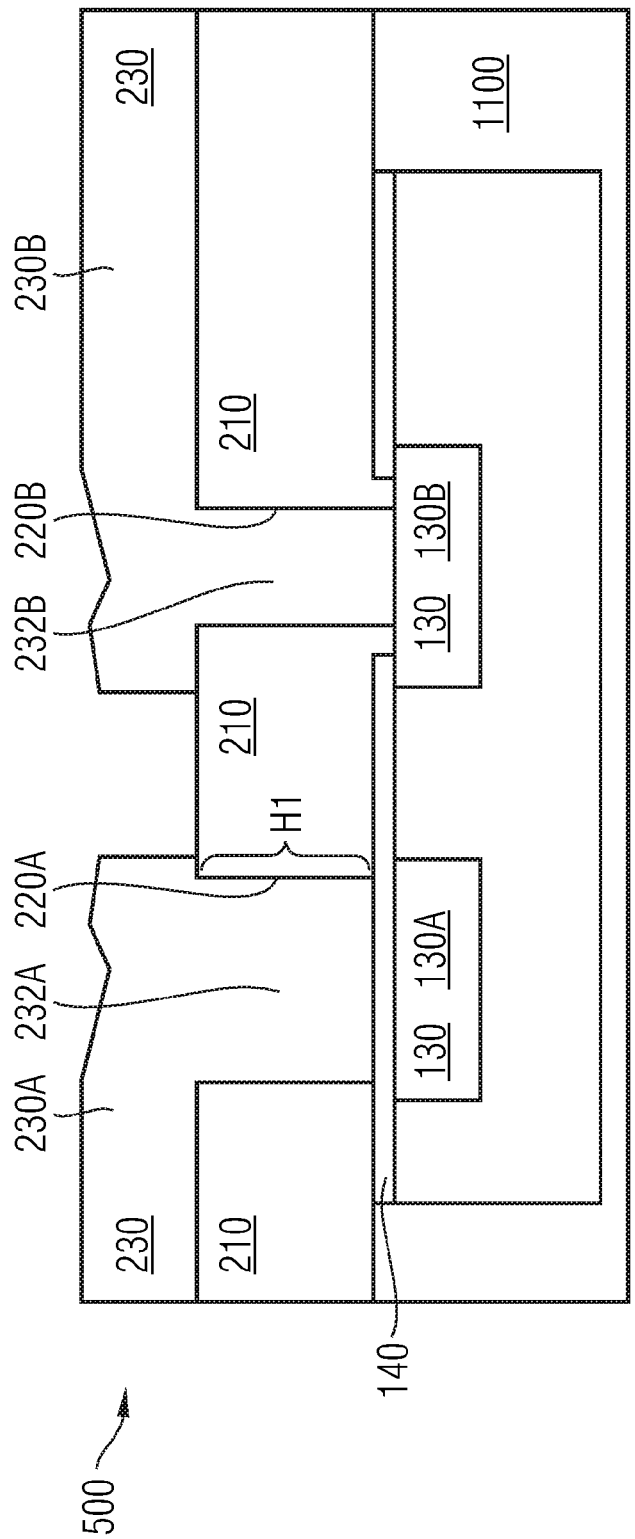

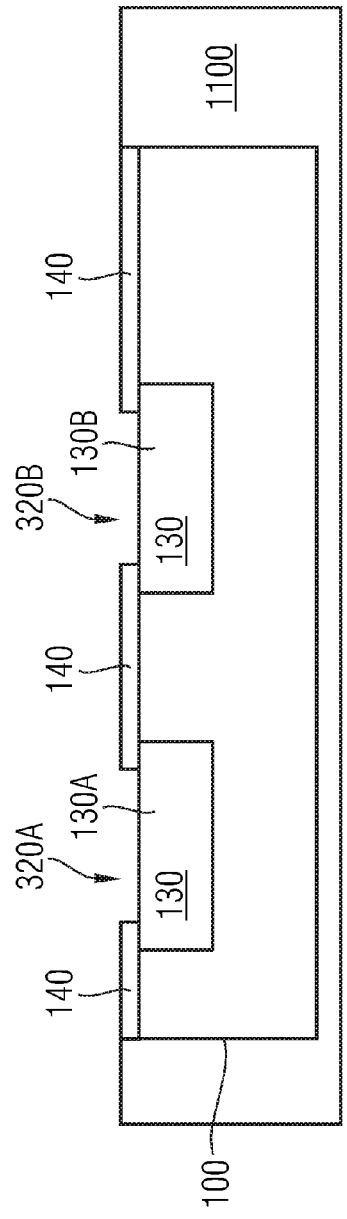
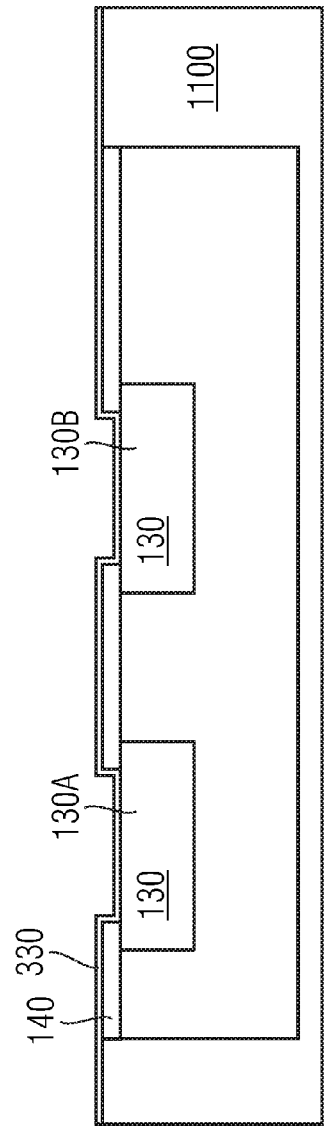

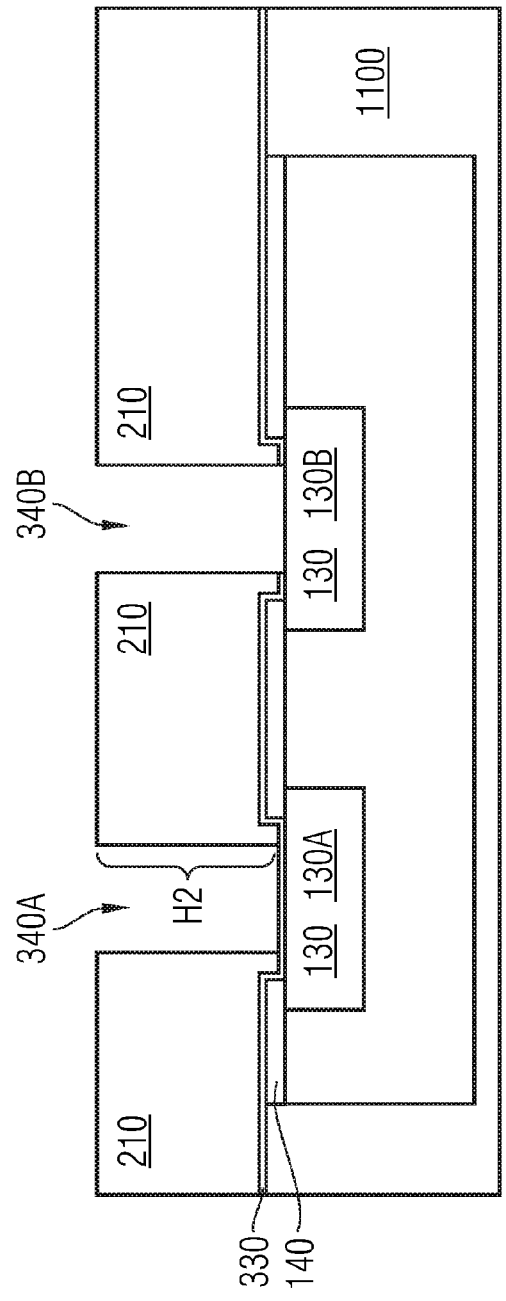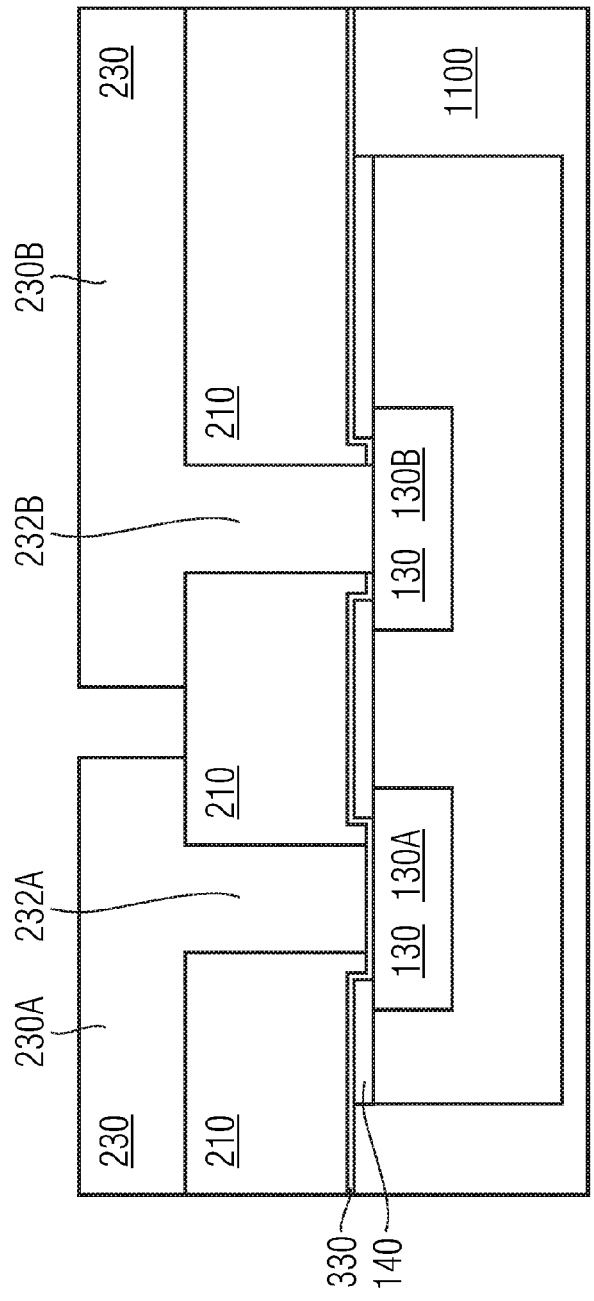

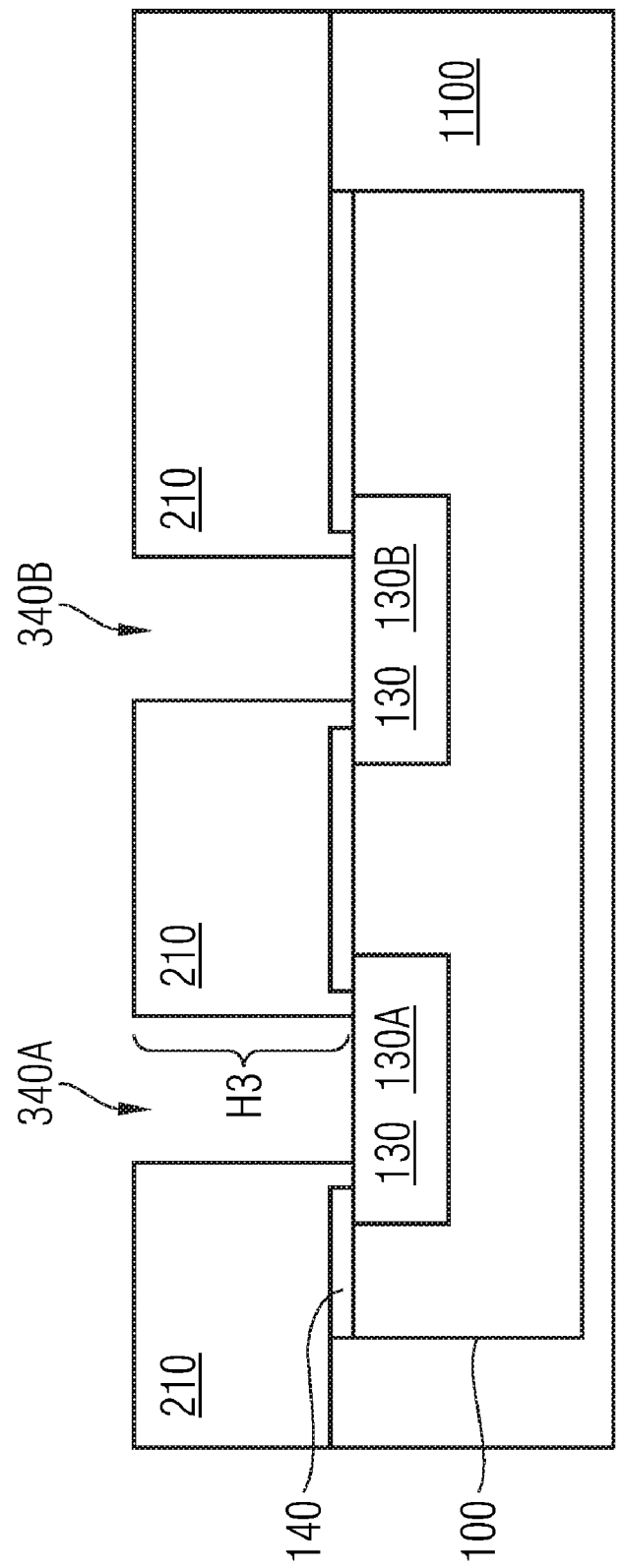

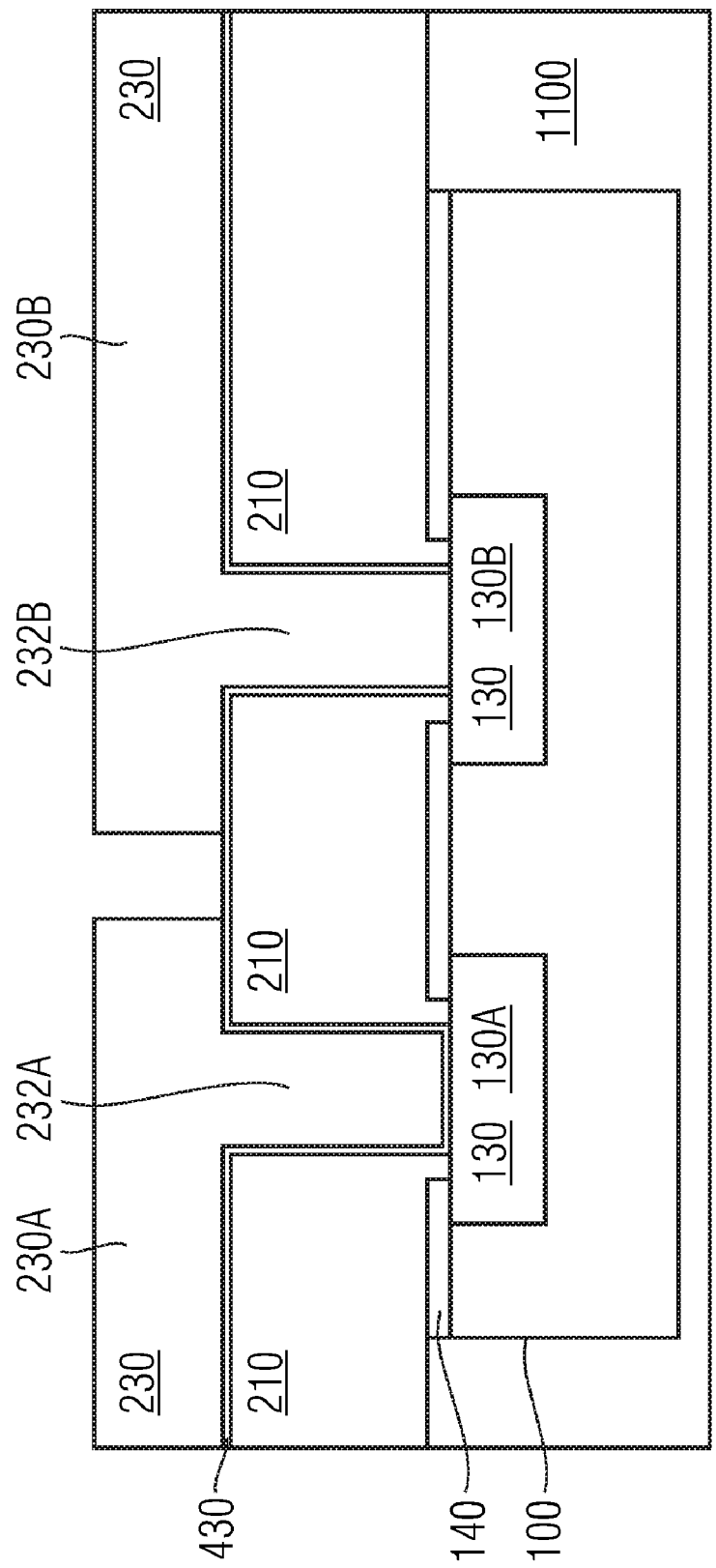

SEMICONDUCTOR DEVICE WITH CAPACITOR

FIELD OF THE INVENTION

Generally, the present invention relates to semiconductor devices and methods of making semiconductor devices. More particularly, the present invention relates to methods for making semiconductor devices having a capacitor.

BACKGROUND OF THE INVENTION

Capacitors which are part of a semiconductor device, such as metal-insulator-metal or MIM capacitors, may require extra processing. An MIM capacitor may be formed as two metal layers with an embedded dielectric layer and this may be processed in addition to the back end of line metal stack. This extra processing may generate extra cost for metal deposition, lithography, and etch. In addition, the quality or Q factor for the capacitor may be low due to high ohmic resistances in the capacitor plates. New methods for making capacitors are needed.

SUMMARY OF THE INVENTION

An embodiment of the invention is a semiconductor structure, comprising: a semiconductor chip having a final metal layer; a dielectric layer disposed over the final metal layer; and a conductive layer deposed over the dielectric layer, the dielectric layer being between the final metal layer and the conductive layer. In one or more embodiments, the dielectric layer may have a thickness of less than 250 nm. In one or more embodiments, the dielectric layer may have a thickness of less than 100 nm.

An embodiment of the invention is a semiconductor structure, comprising: a semiconductor chip having a final metal layer, the final metal layer comprising at least a first final metal line; a redistribution layer comprising at least a first conductive pathway, the conductive pathway disposed over the first final metal line; and a dielectric layer disposed between the final metal layer and the first conductive pathway.

An embodiment of the invention is a semiconductor structure, comprising: a semiconductor chip having a final metal layer; a first dielectric layer having an opening, at least a portion of the opening overlying the final metal layer; a second dielectric layer disposed over a bottom surface of the opening, the second dielectric layer overlying the final metal layer; and a conductive material disposed within the opening, the conductive material overlying the second dielectric layer and the final metal layer.

An embodiment of the invention is a method of making a semiconductor structure, comprising: forming a final metal layer of a semiconductor chip; forming a first dielectric layer over the final metal layer; forming a second dielectric layer of the first dielectric layer; forming an opening through the second dielectric layer, the opening overlying the final metal layer; and forming a conductive material within the opening over the first dielectric layer.

An embodiment of the invention is a method of making a semiconductor structure, comprising: forming a final metal layer of a semiconductor chip; forming a first dielectric layer over the final metal layer; forming a opening through the first dielectric layer; forming a second dielectric layer over the bottom surface of the opening; and forming a conductive material within the opening over the first dielectric layer.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become clear better understood by reference to the following detailed description. The elements of the drawings are not necessarily to scale relative to each other.

FIG. 1 shows an embodiment of a semiconductor chip;
FIG. 2A shows a top view of an embodiment of a reconfigured wafer;
FIG. 3A shows a cross sectional view of an embodiment of a semiconductor structure;
FIG. 3B shows a cross sectional view of an embodiment of a semiconductor structure showing the fan-out region;
FIG. 3C is a top view of an embodiment of a semiconductor structure showing the fan-out region;
FIGS. 4 through 6A show an embodiment of a method of making an embodiment of a semiconductor structure;
FIGS. 9A through 9D show an embodiment of a method of making an embodiment of a semiconductor structure;
FIGS. 10A through 10D show an embodiment of a method of making an embodiment of a semiconductor structure.

DETAILED DESCRIPTION OF THE INVENTION

Figure 2B:
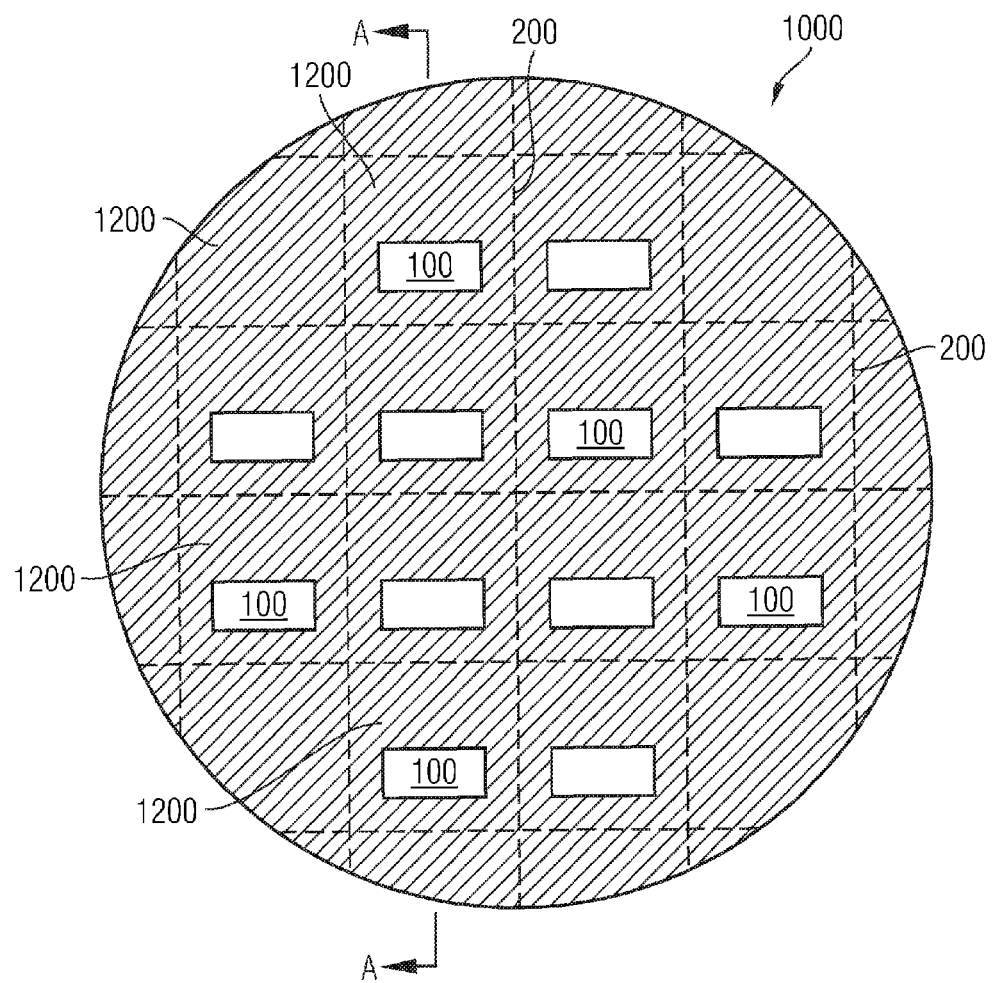
FIG. 2B shows a top view of an embodiment of reconfigured wafer showing the fan-out region.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

FIG. 1 shows a semiconductor chip 100. The semiconductor chip is also referred to as a semiconductor die. The semiconductor chip 100 includes a final metal layer 130. The chips may further include a passivation layer 140 that overlies the final metal layer 130. While not shown, the chip or die 100 typically includes a chip substrate which may be any type of substrate. Examples include, but are not limited to, silicon substrates, silicon on insulator substrates, silicon on germanium substrates, etc. The chip has a bottom surface 102B as well as one or more side surfaces 102S. The active or top surface of the chip is opposite the bottom surface.

The final metal layer 130 may comprise any metallic material. The final metal layer may be any pure metal or metal alloy. The final metal layer may include one or more elements such as Cu, Al, W, Au, or Ag. In one or more embodiments, the final metal layer may include the element C (carbon). Examples of metallic materials which may be used include, not are not limited to, pure copper, copper alloy, pure aluminum, aluminum alloy, pure tungsten, tungsten alloy, pure silver, silver alloy, pure gold, and gold alloy. In one or more embodiments, the final metal layer may also include barrier layers, liners and/or cap layers formed from materials such as Ta, TaN, TaC, Ti, TiN, TiW, WN, WCN, CoWP, CoWB, NiMoP, Ru or combinations thereof.

The final metal layer may comprise at least one metal line. In one or more embodiments, the final metal layer comprises at least two metal lines. In one or more embodiments, each of the final metal lines of the final metal layer may be spacedly disposed from each other. In one or more embodiments, each of the final metal lines may be electrically isolated from each other. In the embodiment shown, the final metal layer includes a first final metal line 130A and a second final metal line 130B. In one or more embodiments, each of the final metal lines 130A,B may have a thickness which is greater than about 250 nm (nanometers) in thickness. In one or more embodiments, each of the final metal lines 130A,B may have a thickness which is greater than about 500 nm (nanometers) in thickness. In one or more embodiments, each of the final metal lines 130A,B may have a thickness which is greater than about 1000 nm (nanometers) in thickness. In one or more embodiments, one or more of the final metal lines may include at least one bonding pad (also referred to as a contact pad). In one or more embodiments, each of the final metal lines may include at least one bonding pad or contact pad. In one or more embodiments, one or more of the final metal lines may be a boding pad or contact pad.

The semiconductor chip 100 may further include a passivation layer 140. In one or more embodiments, the passivation layer 140 may comprise a dielectric material. In one or more embodiments, the passivation layer 140 may consist essentially of a dielectric material. The passivation layer 140 may, for example, comprise one or more dielectric layers such as oxides, nitrides, oxynitrides and/or imides. As an example, the passivation layer 140 may comprise two or more layers. As an example, the passivation layer 140 may comprise an oxide layer overlying a nitride layer. As another example, the passivation layer 140 may comprise a nitride layer overlying an oxide layer. An another example, the passivation layer 140 may comprise a nitride-oxide-nitride stack (that is, a nitride layer overlying a oxide layer overlying another nitride layer). As another example, the passivation layer may comprise an oxide-nitride-oxide stack (that is, an oxide layer overlying a nitride layer overlying an oxide layer). In another embodiment, the passivation layer may comprise a high-K dielectric material. In an embodiment, the high-K material may have a dielectric constant greater than that of silicon dioxide. In an embodiment, the high-K material may have a dielectric constant greater than 3.9.

In one embodiment, the thickness of the oxide layer and/or the thickness of the nitride layer may be less than about 500 nm (nanometer). In another embodiment, the thickness of the oxide layer and/or the thickness of the nitride layer may be less than about 250 nm. In another embodiment, the thickness of the oxide layer and/or the thickness of the nitride layer may be less than about 200 nm. In another embodiment, the thickness of the oxide layer and/or the thickness of the nitride layer may be less than about 150 nm. In another embodiment, the thickness of the oxide layer and/or the thickness of the nitride layer may be less than about 100 nm. In another embodiment, the thickness of the oxide layer and/or the thickness of the nitride layer may be greater than about 50 nm. In another embodiment, the thickness of the oxide layer and/or the thickness of the nitride layer may be greater than about 25 nm.

In one or more embodiments, the thickness of the passivation layer 140 may be less than about 1000 nm. In one or more embodiments, the thickness of the passivation layer 140 may be less than about 500 nm. In one or more embodiments, the thickness of the passivation layer 140 may be less than about 250 nm. In one or more embodiments, the thickness of the passivation layer 140 may be less than about 200 nm. In one or more embodiments, the thickness of the passivation layer 140 may be less than about 150 nm. In one or more embodiments, the thickness of the passivation layer 140 may be less than about 100 nm. In one or more embodiments, the thickness of the passivation layer 140 may be less than about 50 nm. In one or more embodiments, the thickness of the passivation layer 140 may be less than about 30 nm. In one or more embodiments, the thickness of the passivation layer 140 may be less than about 25 nm. In one or more embodiments, the thickness of the passivation layer 140 may be less than about 15 nm. In one or more embodiments, the thickness of the passivation layer 140 may be less than about 10 nm. In one or more embodiments, the thickness of the passivation layer 140 may be greater than about 10 nm. In one or more embodiments, the thickness of the passivation layer 140 may be greater than about 15 nm.

The chip 100 is, of course, a simplification for illustration purposes only and may further include additional metal layers, additional dielectric layers as well as semiconductor components such as diodes, transistors, etc. One or more of the final metal lines may be electrically coupled to the chip substrate and to devices in the chip substrate.

In the embodiment shown in FIG. 1, an opening 150 is formed through the passivation layer 140 so as to expose the second final metal line 130B. The opening 150 may be in the form of a hole and may be referred to as a via opening. It is possible, as well, that the opening 150 be formed as a trench. The opening 150 provides for future electrical coupling of the second metal line 130B to, for example, a redistribution layer. Of course, an additional opening may be formed in the first metal line 130A. The opening 150 may be formed by a wet etch process or a dry etch process. In one or more embodiments, the opening 150 may be formed over a bonding pad or contact pad of the final metal line 130B.

The semiconductor chip 100 may be formed on a single semiconductor wafer with additional identical semiconductor chips. A plurality of semiconductor chips 100 may be formed at the same time on a single semiconductor wafer. The semiconductor chip may then be grinded to reduce its thickness. In one or more embodiments, the thickness may be reduced to a thickness of less than about 500 nm. In one or more embodiments, the thickness may be reduced to a thickness of less than about 300 nm. In one or more embodiments, the thickness may be greater than about 50 nm. In one or more embodiments, the thickness may be greater than about 100 nm. The semiconductor wafer may then be singulated or diced into individual chips. Singulation or dicing may be done with a diamond saw or a laser (or by some other method).

After forming individual semiconductor chips (such as shown in FIG. 1), the chips may be assembled together to form a reconfigured wafer. An embodiment of a reconfigured wafer 1000 is shown in FIG. 2A. The reconfigured wafer 1000 may be formed by first doing a pre-assembly of at least one semiconductor chip 100 onto a carrier. In one or more embodiments, the pre-assembly process places a plurality of individual semiconductor chips 100 in a regular fashion with a certain distance to each other. In one or more embodiments, this distance may be about 1000 nm (nanometers) to about several millimeters. In one or more embodiments, the distance between the chips on the reconfigured wafer 1000 is greater than the distance between the chips on their original wafer. In one or more embodiments, the average distance between the chips on the reconfigured wafer 1000 is greater than the average distance between the chips on their original wafer. The pre-assembly process may be done by placing the chips onto the surface of a carrier using a double sided adhesive tape.

Hence, in one or more embodiments, the chips may be placed face down onto the tape. That is, the top or active surface of the chip 100 faces toward the tape. The chip bottom points away from the tape.

After placing the semiconductor chips 100 onto a tape, the chips may be embedded into a support structure. The support structure may also be referred to as a support substrate. This may be done is various ways. For example, the tape and the chips may be placed within a molding chamber, which is then filled with a liquid molding compound. The molding material may, for example, be some type of dielectric material. The molding compound may be a variety of materials such as a plastic, polyimide, an epoxy based material or a BCB (Benzo-cyclo-butene). In one or more embodiments, the molding compound may have a low coefficient of thermal expansion (CTE) or a CTE that matches that of the semiconductor chip (which may have a silicon substrate). The molding compound fills in the spaces between the chips and the assemblies. In one or more embodiments, it may be poured to a level below the bottom surface of the chips. In one or more embodiments, it may be poured to a level above the bottom surface of the chips.

After a molding compound has been used, an application of heat and/or pressure may then be used to harden the resin and build a planar assembly of a molded wafer with the embedded chips. The molded wafer may then be removed from the carrier plate and the tape may be peeled away from the molded reconfigured wafer. The molding compound forms a support (also referred to herein as a support structure or a support substrate) for the reconfigured wafer.

In one or more embodiments of the invention, the molding compound may contact the side surfaces and the bottom surfaces of at least one chip but not the top surface. In one or more embodiments, the molding compound may contact the side surfaces of at least one chip and at least a portion of the top surface but not the bottom surface. In one or more embodiments, the molding compound may contact the side surfaces of at least one chip but not the bottom surface or the top surface (so as to leave the top surface and bottom surface exposed). In one or more embodiments, after the tape is removed, the top or active surfaces of the semiconductor chips are revealed to be exposed through the top surface of the support structure.

In one or more embodiments, the chips may be embedded within the support substrate whereby the support contacts the bottom and side surfaces of the chips but not the top surfaces of the chip. In one or more embodiments, the chips may be embedded within the support such that the support substrate may be formed over at least a portion of the top surfaces of the chips. In one or more embodiments, the chips may be embedded within the support such that the support substrate contacts the sides of the chips but not the top surfaces and not the bottom surfaces of the chips. In one or more embodiments, it is also possible that the chips be embedded within the support such that the top surfaces of the chips stick up from the top surface of the support.

In one or more embodiments, the chips may be at least partially embedded within the support. In one or more embodiments, the chips may be partially embedded within the support. In one or more embodiments, the chips may be totally embedded within the support.

FIG. 2A shows a top view of an embodiment of a reconfigured wafer 1000 that includes chips 100 embedded and supported within a support structure 1100. The wafer 1000 includes a plurality of structures 200. Each structure 200 represents an embodiment of an individual partially completed semiconductor device. Each of the structures 200 includes a semiconductor chip 100. In the embodiment shown in FIG. 2A, the distances between the chips 100 in the reconfigured wafer 1000 may be larger than they were when the chips were initially formed. In one or more embodiments, in a downstream processing step, the reconfigured wafer may be singulated so as to form a plurality of individual devices.

Figure 2C:
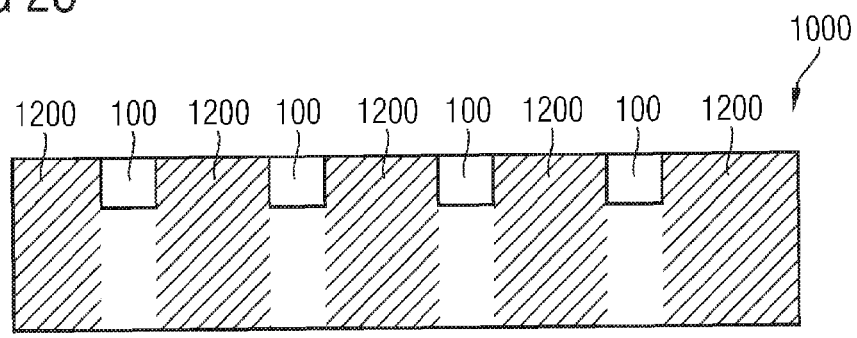
FIG. 2C shows a cross sectional view of an embodiment of a reconfigured wafer.

Referring to FIG. 2A, it is seen that the lateral dimensions of the reconfigured wafer 1000 extend beyond the lateral dimensions of the chips 100. The portion of the wafer 1000 that is laterally outside the lateral boundaries of the chips 100 is referred to as the fan-out region of the reconfigured wafer 1000. FIG. 2B shows a top view of the fan-out region 1200 of the wafer 1000. In FIG. 2B, the fan-out region 1200 is shown as the hatched region. FIG. 2C shows a cross sectional view of the wafer 1000 though AA showing the chips 100 as well as the fan-out region 1200 of the wafer 1000.

FIG. 3A shows a cross sectional view of an individual structure 200 that includes a semiconductor chip 100 disposed within a support structure 1100. It is understood that the structure 200 shown in FIG. 3A represents a portion of the reconfigured wafer 1000 shown in FIG. 2A and that it represents one of a plurality of identical structures 200 which are part of the reconfigured wafer 1000 shown in FIG. 2A.

Referring to the embodiment shown in FIG. 3A, it is seen that the passivation layer 140 is formed as part of the chip over the final metal layer 130 before the chip 100 is embedded within the support 1100. However, in another embodiment, it is possible that the passivation layer 140 be formed over the final metal layer 130 after the chip 100 is embedded into the support 1100.

Referring to FIG. 3A, it is seen that the lateral boundaries of the structure 200 extend beyond the lateral boundaries of the chip 100. The portion of structure 200 that is laterally outside the lateral boundaries of the chip 100 is referred to as the fan-out region of the structure 200. FIG. 3B shows a cross sectional view of the fan-out region 1200 of the structure 200. FIG. 3C shows a top view of the structure 200 with the fan-out region 1200.

Referring to FIG. 4, in a downstream processing step, a dielectric layer 210 is deposited over the structure 200 shown in FIG. 3A to form the structure 300 shown in FIG. 4. The dielectric layer 210 may comprise any dielectric material including, for example, an oxide, a nitride, or an oxynitride. The dielectric layer 210 may also comprise a polyimide. The dielectric layer 210 may have any thickness. In one or more embodiments, the dielectric layer 210 may be formed of a different material from the passivation layer 140. In one or more embodiments, the dielectric layer 210 may be formed of the same material from the passivation layer 140. In one or more embodiments, it is possible that the dielectric layer 210 be formed of a high-K material.

In one or more embodiments, the thickness of dielectric layer 210 may be greater than about 250 nm. In one or more embodiments, the thickness of dielectric layer 210 may be greater than about 500 nm. In one or more embodiments, the thickness of dielectric layer 210 may be greater than about 750 nm. In one or more embodiments, the thickness of dielectric layer 210 may be greater than about 1000 nm. In one or more embodiments, the thickness of dielectric layer 210 may be greater than about 2000 nm. In one or more embodiments, the thickness of dielectric layer 210 may be greater than about 5000 nm. In one or more embodiments, the thickness of the dielectric layer 210 may be greater than about 10000 nm (10 microns). In one or more embodiments, the thickness of layer 210 may be greater than about 15000 nm (15 microns). In one or more embodiments, the thickness of layer 210 may be greater than about 20000 nm (20 microns). In one or more embodiments, the thickness of layer 210 may be less than about 20000 nm (20 microns). The thickness of the dielectric layer 210 is shown in FIG. 4 and FIG. 5 as the height H1.

In one or more embodiments, the thickness of the dielectric layer 210 may be greater than the thickness of passivation layer 140. In one or more embodiments, the thickness of the dielectric layer 210 may be greater than about five times the thickness of passivation layer 140. In one or more embodiments, the thickness of dielectric layer 210 may be greater than about ten times the thickness of passivation layer 140. In one or more embodiments, the thickness of dielectric layer 210 may be greater than about 15 times the thickness of passivation layer 140. In one or more embodiments, the thickness of dielectric layer 210 may be greater than about 20 times the thickness of passivation layer 140. In one or more embodiments, the thickness of dielectric layer 210 may be greater than about 25 times the thickness of passivation layer 140. In one or more embodiments, the thickness of dielectric layer 210 may be greater than about 50 times the thickness of passivation layer 140. In one or more embodiments, the thickness of dielectric layer 210 may be greater than about 100 times the thickness of passivation layer 140.

Referring to FIG. 5, openings 220A and 220B are formed through the dielectric layer 210 over the final metal layer 130. In particular, openings 220A and 220B are formed over the first final metal line 130A and the second final metal layer 130B. In one or more embodiments, the opening 220A may be formed over a bonding or contact pad of the first final metal line 130A. In one or more embodiments, the opening 220B may be formed over bonding or contact pad of the second final metal line 130B. The height H1 of the opening 220A corresponds to the thickness H1 of the dielectric layer 210. Examples of such thicknesses have been described above.

The openings 220A and 220B may be formed at positions defined by a lithographic step or by use of, for example, a photosensitive imide. In one embodiment, the openings 220A and 220B may be formed by first etching the opening 220A through the dielectric layer 210A and stopping on the passivation layer 140. Next, the opening 220B is formed by etching through both the dielectric layer 210 as well as the passivation layer 140.

In another embodiment, the openings 220A, 220B may be formed using another process. In a first step, the dielectric layer 210 may etched with a stop on the passivation layer 140 over both the first and second metal lines 130A,B (where the passivation layer 140 may be a combination of oxide and nitride layers). The etching can be performed by using a selective wet etching or a selective dry etching process. In a second step, the passivation layer 140 over the second metal line 130B may be etched through so as to expose the second metal line 130B. The passivation layer 140 is not etched through over the first metal line 130A.

Referring to FIG. 6A, in a downstream processing step, a conductive layer 230 is deposited over the structure 400 from FIG. 5 and then patterned. The conductive layer 230 may be formed of any conductive material. In one or more embodiments, the conductive material 230 may be a metallic material. In one or more embodiments, the conductive material 230 may be a non-metallic material such as a doped polysilicon or a conductive polymer. The structure 500 in FIG. 6A shows an embodiment of how a conductive layer 230 may be deposed and patterned. FIG. 6A also shows the height H1 of the opening 220A.

In one or more embodiments, the conductive layer 230 may form a redistribution layer for the structure 500. In one or more embodiments of the invention, the redistribution layer 230 may be useful for a wafer level ball package design. In one or more embodiments, redistribution layer may, for example, be useful in redistributing electrical signals and electrical energy to other portions of the semiconductor device. Electrical signals and energy includes electrical currents and voltages. In addition, the redistribution layer 230 may also redistribute the electrical signals and energy to positions that do not overlie the chip but instead to positions that are outside the lateral boundary of the chip. In one or more embodiments, the redistribution layer 230 may serve to electrically couple the final metal lines on the semiconductor chip with wafer level balls which may be part of a wafer level ball package design. The wafer level balls (which may, for example, be metallic balls or solder balls) may be positioned over the chip or may be positioned outside the lateral boundary of the chip so they do not overlie the chip.

In one or more embodiments, the conductive or redistribution layer 230 may be formed of a metallic material. Generally, any metallic material may be used. As an example, the redistribution layer 230 may include one or more elements such as Cu, Al, W, Au, or Ag. In one or more embodiments, the redistribution layer 230 may include the element C. Examples of metallic materials which may be used for the redistribution layer include, not are not limited to, pure copper, copper alloy, pure aluminum, aluminum alloy, pure tungsten, tungsten alloy, pure silver, silver alloy, pure gold, and gold alloy.

The redistribution layer may include one or more conductive pathways. In one or more embodiments, the redistribution layer may include two or more conductive pathways. In one or more embodiments, each of the conductive pathways may be spacedly disposed from the other conductive pathways. In one or more embodiments, each of the conductive pathways may be electrically isolated from each other. In one or more embodiments, two or more of the conductive pathways may be electrically coupled to each other.

Hence, in one embodiment, the redistribution layer may be a single continuous conductive layer. However, the redistribution layer need not be a single continuous conductive layer. In one or more embodiments, the redistribution layer may comprise a plurality of spacedly disposed conductive pathways. Each of the conductive pathways may have any shape. For example, they may be straight or curved. They may be star shaped (for example, fingers radiating from a central location). A conductive pathway of a redistribution layer may also be referred to herein as a conductive pathway.

Referring to FIG. 6A, it is seen that the redistribution layer 230 includes a first conductive pathway 230A and a second conductive pathway 230B. The first conductive pathway 230A includes at least a portion 232A which is disposed within the opening 220A over the passivation layer 140 and over the final metal line 130A. The portion 232A is electrically insulated from the first final metal line 130A by the passivation layer 140. The conductive pathway 230B includes at least a portion 232B which is disposed within the second opening 220A over the final metal line 130B. The portion 232B makes electrical contact with the second final metal line 130B. The second conductive pathway 230B (including portion 232B within the opening 220B) may serve to electrically couple the second final metal line 130B to at least one wafer level ball of a wafer level package design. The wafer level ball may overlie the chip or it may be disposed outside the lateral boundary of the chip.

In one or more embodiments, the portion of the first conductive pathway 230A that is formed in the opening 220A may be formed of a different material (for example, a different conductive material or a different metallic material) from the portion of the conductive pathway 230A that may not be formed within the opening 220A. Likewise, in one or more embodiments, the portion of the second conductive pathway 230B that is formed within the opening 230B may be formed of a different material (for example, a different conductive material or a different metal) from the portion of the conductive pathway 230B that may not be formed within the opening 220B.

As noted, the portion 232A of the first conductive pathway 230A is electrically insulated from the first final metal line 130A by the passivation layer 140. The portion 232A of the first conductive pathway 230A serves as a first conductive plate (in this case, a top conductive plate) of a capacitor or capacitive element. At least a portion of the first final metal line 130A underlying opening 220A serves as a second conductive plate (in this case a bottom conductive plate) of the capacitor or capacitive element. The passivation layer 140 serves as the dielectric or insulator for the capacitor or capacitive element. While not wishing to be bound by theory, it is possible that portions of conductive pathway 230A which are more proximate to the final metal line 130A may contribution more to the capacitance of the capacitor than portions which are more remove from the final metal line 130A.

As noted above, in one or more embodiments, the redistribution layer 230 (including conductive pathway 230A and portion 232A) may be formed of a metallic material. When this is the case, both the first and second conductive plates of the capacitor are formed of metallic materials so that the capacitor may thus be described as a metal-insulator-metal or MIM capacitor.

The first metal line 130A may include a bonding pad or bonding contact which underlies the openings 220A. Hence, in one or more embodiments, the bottom conductive plate of the capacitor may be formed from a bonding pad or bonding contact of the final metal layer.

Hence, FIG. 6A shows that a capacitor, such as an MIM (metal-insulator-metal capacitor), may formed from a standard wafer level ball (WLB) package manufacturing process. The advantage of this processing is that a capacitor, such as an MIM capacitor, may be generated without extra mask steps or processing steps during the silicon or packaging processing. In addition, this capacitor may have a higher quality factor (Q factor) since the conductive layers (such as, for example, metallic layers) that are used as the capacitor plates may be relatively thick and thus highly conductive. Hence, the capacitor (such as an MIM or metal-insulator-metal capacitor) may be formed using at least a portion of a final metal line 130A as the first capacitor plate, at least the portion 232A of a conductive pathway 230A as a second capacitor plate, and at least a portion of a passivation layer 140 as the capacitor dielectric between the first and second capacitor layers or plates.

Referring to FIG. 6A, in one or more embodiments, the first conductive pathway 230A may be spacedly disposed and electrically isolated from the second conductive pathway 230B. In one or more embodiments, the first conductive pathway 230A may be coupled to a voltage source or to a ground. In one or more embodiments, the first conductive pathway 230A may be floating. In one or more embodiments, the first conductive pathway 230A may be electrically coupled to another conductive pathway that is not shown. In one or more embodiments, the first conductive pathway 230A may be electrically coupled to the second conductive pathway 230B by some type of conductive interconnect.

Figure 6B:
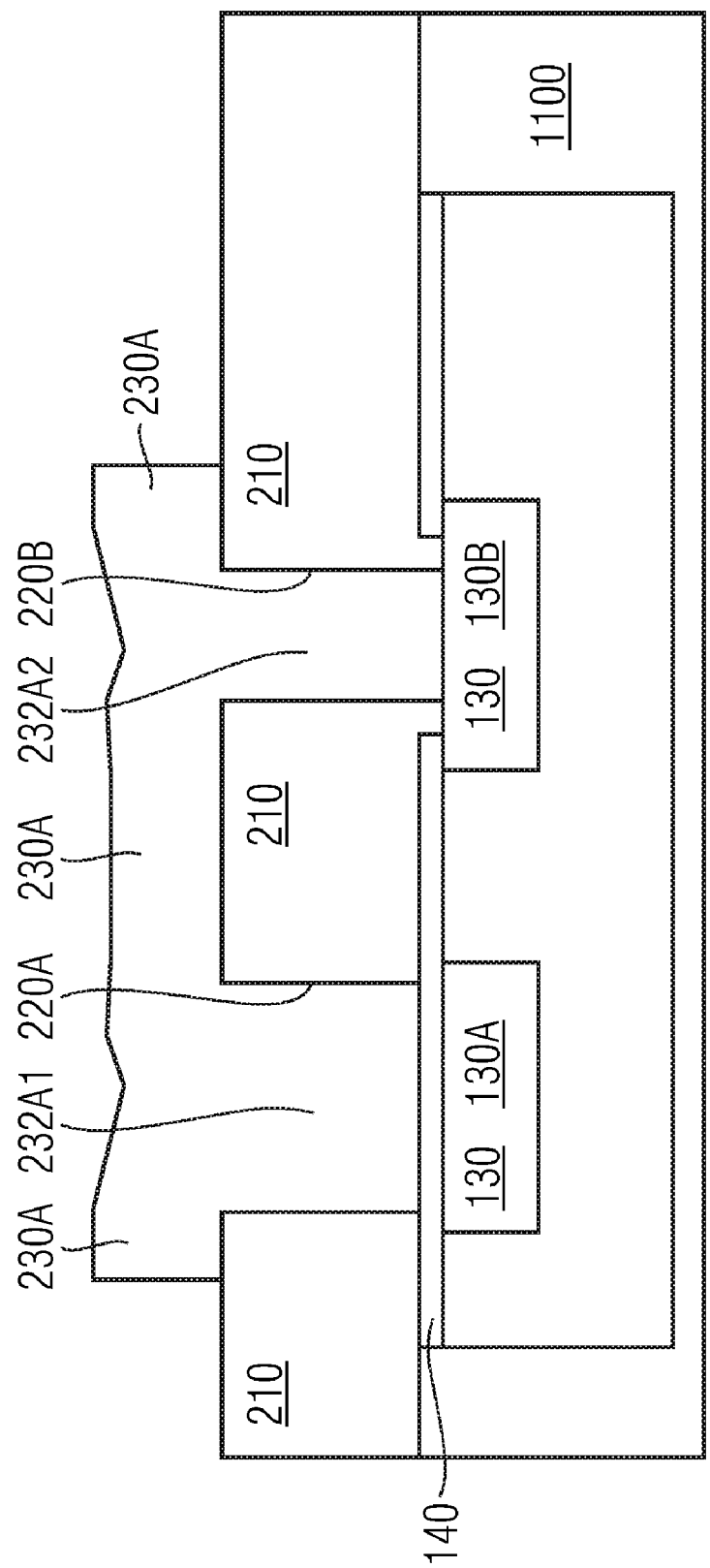
FIG. 6B shows an embodiment of a semiconductor structure.

In another embodiment, referring to FIG. 6B, it is seen that the same conductive pathway 230A of the redistribution layer may have a portion 232A1 disposed in the opening 220A and a portion 232A2 disposed within the opening 230B. As an example, in the embodiment shown in FIG. 6B, it is thus possible that at least a portion of the final metal line 130A (serving as a bottom plate of a capacitor such as, for example, an MIM capacitor) may be electrically coupled to a device formed in the chip substrate. A portion 232A1 (serving as top plate of the same capacitor) may thus be electrically coupled to the second final metal line 130B which, in turn, may be electrically coupled to the same or to another device formed in the chip substrate. Hence, it is thus possible that both the top and bottom conductive plates of the formed capacitor be electrically coupled to a device or to devices in the chip substrate.

Figure 7A:
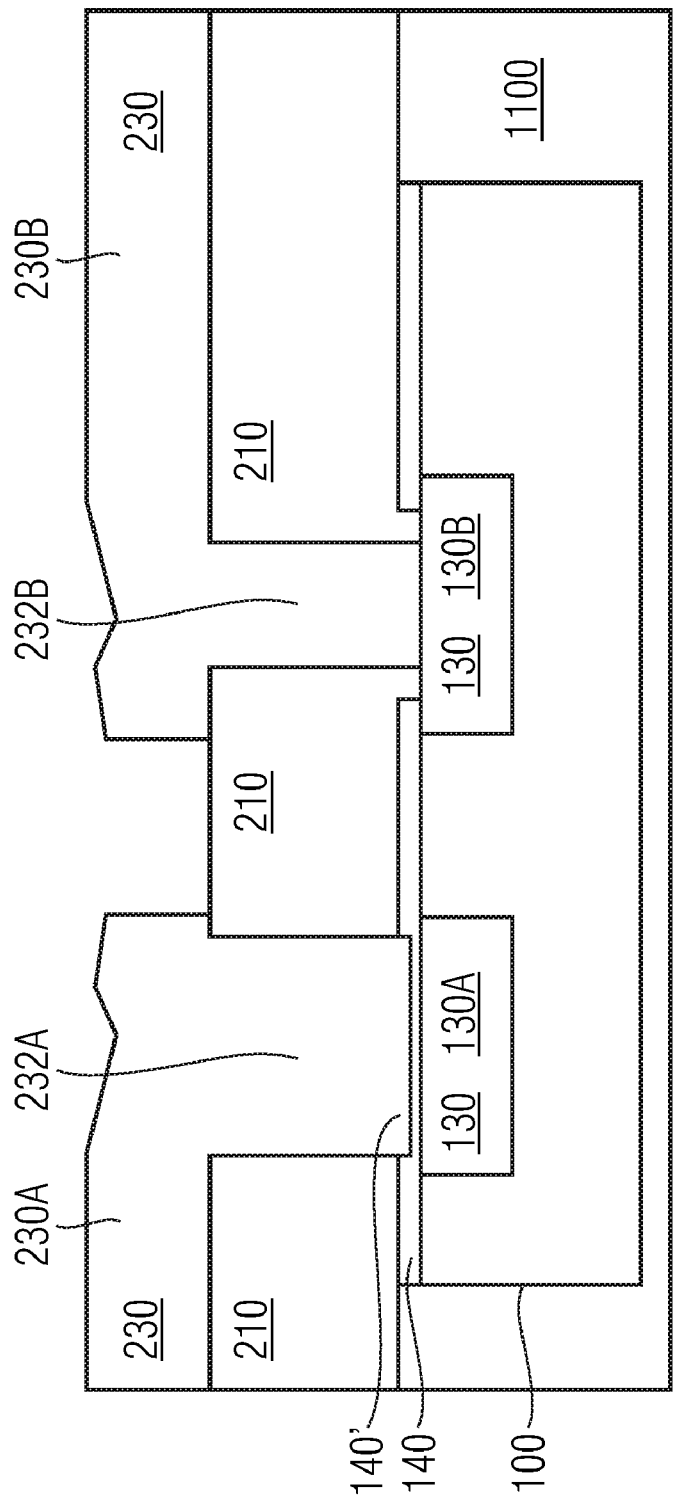
FIG. 7A shows an embodiment of a semiconductor structure.

Another embodiment is shown in FIG. 7A. FIG. 7A shows a structure 700 that includes a chip 100 embedded within a support 1100. Referring to FIG. 7A, an etching process may be used to decrease the thickness of a portion 140' of the passivation layer 140 (of chip 100) that is between the first metal line 130A of the final metal layer and the portion 232A of the first conductive pathway 230A. Thinning the passivation layer 140 between the plates of the formed capacitor (which may, for example, be a metal-insulator-metal capacitor) may be used to increase the capacitance per area of the capacitor.

This thinning step can be done with the use of a selective etching process when the passivation layer 140 is a multilayer stack comprising at least one oxide layer and at least one nitride layer. In one or more embodiments, the passivation layer 140 shown in FIG. 7A may be a dielectric stack comprising a first nitride layer, an oxide layer overlying the first nitride layer, and a second nitride layer overlying the oxide layer. The dielectric stack may be thinned by etching away the second (e.g., top) nitride layer using either a wet or a dry etching process. The etching used may thus be selective to the oxide. Additionally, a second etching step may be performed so that the oxide layer is also etched away. The etching of the oxide layer may be done using wet chemical etchings selective to nitride and imide (assuming, for example, that the dielectric layer 210 is formed of an imide). In one or more embodiments, the thinned passivation layer 140' may have a thickness less than about 500 nm. In one or more embodiments, the thinned passivation layer 140' may have a thickness less than about 250 nm. In one or more embodiments, the thinned passivation layer 140' may have a thickness less than about 150 nm. In one or more embodiments, the thinned passivation layer 140' may have a thickness less than about 100 nm. In one or more embodiments, the thinned passivation layer 140' may have a thickness less than about 50 nm. In one or more embodiments, the thinned passivation layer 140' may have a thickness less than about 25 nm. In one or more embodiments, the thinned passivation layer 140' may have a thickness less than about 20 nm. In one or more embodiments, the thinned passivation layer 140' may have a thickness less than about 15 nm. In one or more embodiments, the thinned passivation layer 140' may have a thickness less than about 10 nm.

Figure 7B:
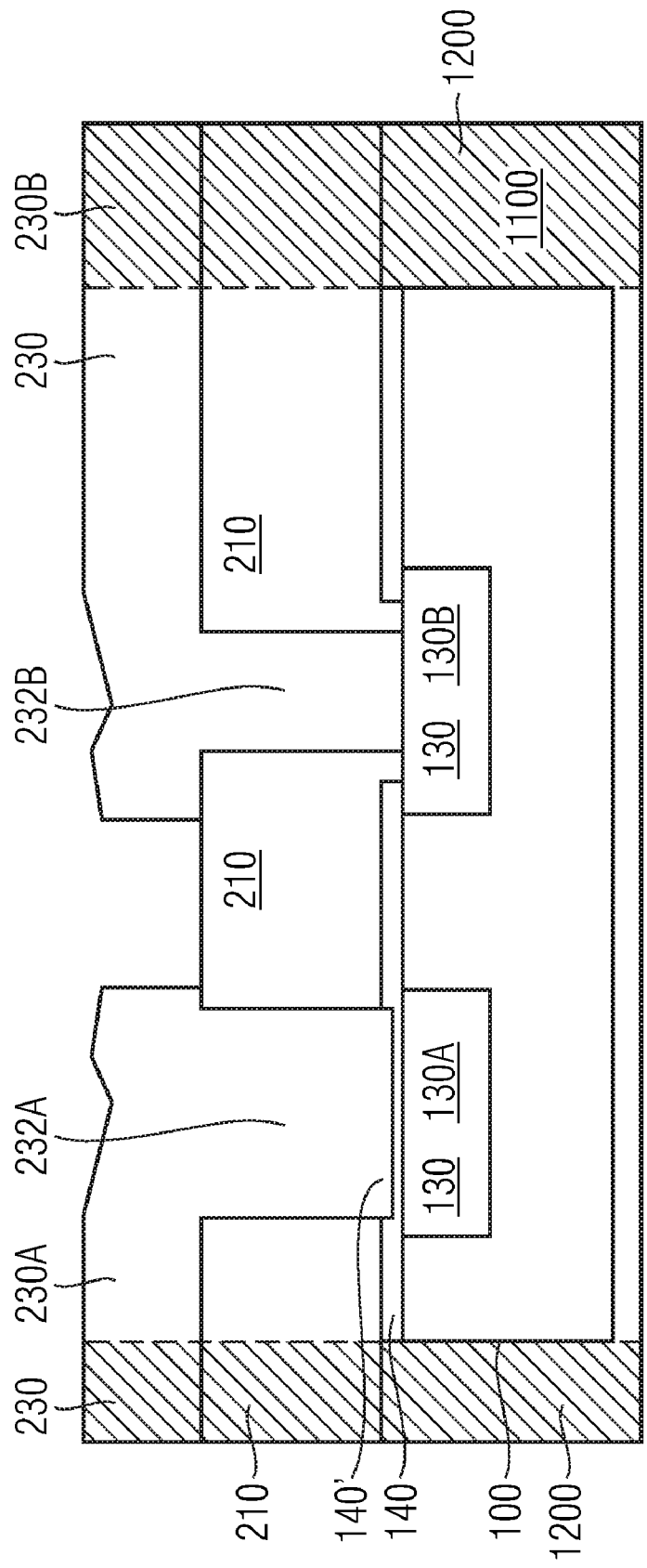
FIG. 7B shows an embodiment of a semiconductor structure showing the fan-out region.

FIG. 7B shows the same structure from FIG. 7A but also shows the fan-out region 1200 of the structure. As noted, the fan-out region 1200 is that portion of the structure which is outside the lateral boundary of the chip 100. The fan-out region 1200 is shown as the hatched region 1200. In the embodiment shown in FIG. 7A, at portion of the first conductive pathway 230A is within the fan-out region 1200 of the structure 700. Likewise, a portion of the second conductive pathway 230B is also within the fan-out region of the structure 700.

Figure 8:
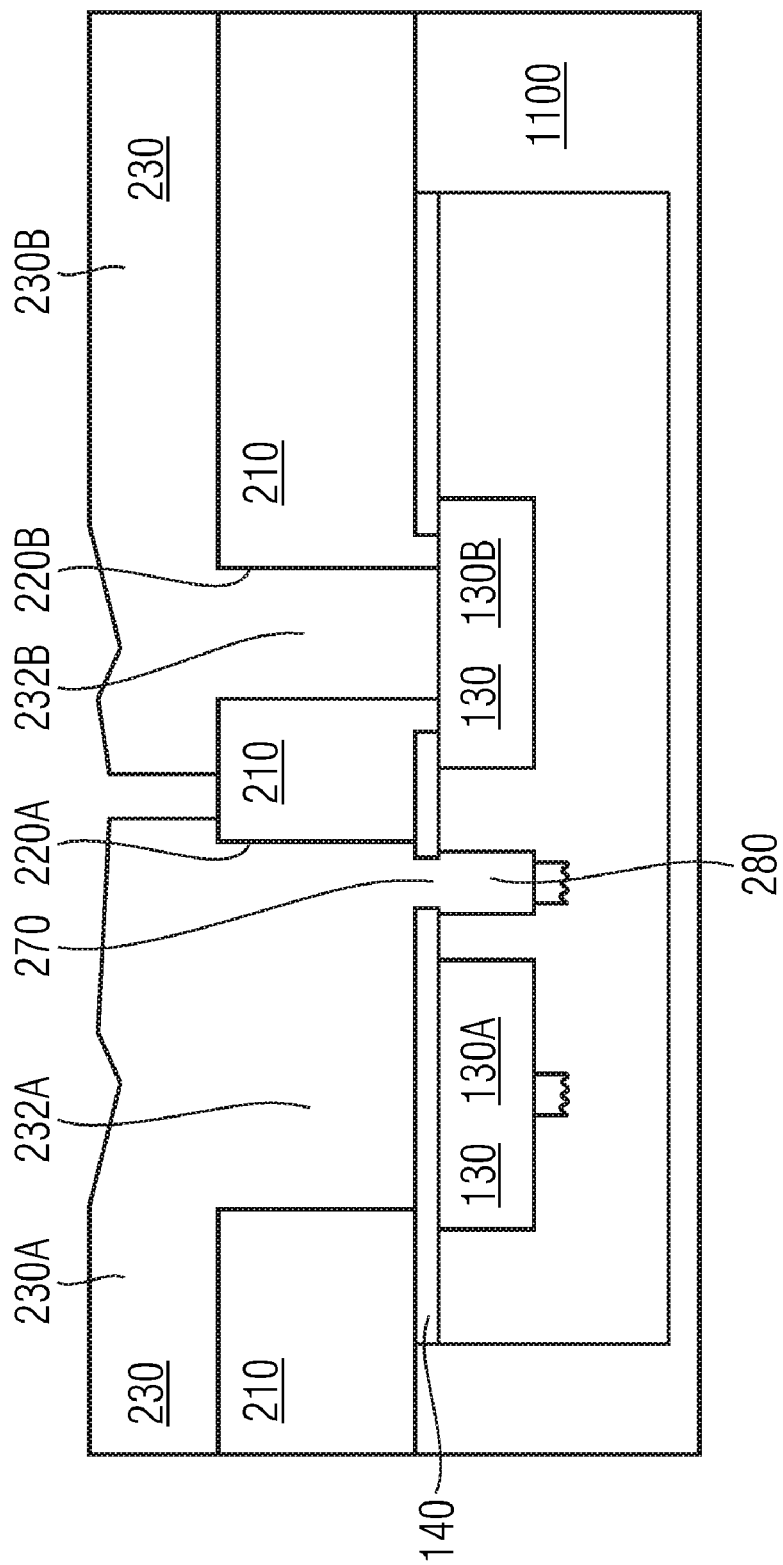
FIG. 8 shows an embodiment of a semiconductor structure.

FIG. 8 shows another embodiment of a semiconductor structure or device. In this embodiment, the first opening 220A overlying the first final metal line 130A has been widened. An opening 270 has been made through the passivation layer 140 so that the portion 232A (serving as a top conductive plate of a capacitor) is electrically coupled to an electrical contact 280 (which may be formed of the same material as the first conductive pathway 230A). The electrical contact 280 may be used to electrically couple the portion 232A (serving as a top conductive plate of a capacitor) to other portions of the semiconductor chip 100. Likewise, the final metal line 130A (serving as a bottom conductive plate of the same capacitor) may be electrically coupled to other portions of the semiconductor chip.

FIG. 9D shows another embodiment of a semiconductor structure or device. FIGS. 9A through 9D show a method of manufacturing the structure shown in FIG. 9D. FIG. 9A shows a semiconductor chip 100 embedded in a support structure 1100. The support structure 1100 may be a mold compound. The chip 100 includes final metal layer 130 that includes the first final metal line 130A and second final metal line 130B. The chip 100 further includes a passivation layer 140. As noted above, in one or more embodiments, the passivation layer 140 may be formed of any dielectric materials. Possible materials and possible thicknesses have been described above.

Referring to FIG. 9A, a first opening 320A is formed in the passivation layer 140 over first final metal line 130A. A second opening 320B is formed in the passivation layer 140 over the second final metal line 130B.

In one or more embodiments, the first opening 320A may be formed over a bonding or contact pad of the first final metal line 130A. In one or more embodiments, the second opening 320B may be formed over a bonding or contact pad of the second final metal line 130B.

Referring to FIG. 9B, a dielectric layer 330 may be deposited over the passivation layer 140 as well as in the first and second openings 320A,B (over both the first and second metal lines 130A and 130B).

In one or more embodiments, the dielectric layer 330 may have a thickness less than about 500 nm. In one or more embodiments, the dielectric layer 330 may have a thickness less than about 250 nm. In one or more embodiments, the dielectric layer 330 may have a thickness less than about 200 nm. In one or more embodiments, the dielectric layer 330 may have a thickness less than about 150 nm. In one or more embodiments, the dielectric layer 330 may have a thickness which is less than about 100 nm. In one or more embodiments, the dielectric layer 330 may have a thickness less than about 50 nm. In one or more embodiments, the dielectric layer 330 may have a thickness which is less than about 25 nm. In one or more embodiments, the dielectric layer 330 may be less than about 20 nm. In one or more embodiments, the dielectric layer 330 may be less than about 15 nm. In one or more embodiments, the dielectric layer 330 may be less than about 10 nm. In one or more embodiments, the dielectric layer 330 may have a thickness greater than about 10 nm. In one or more embodiments, the dielectric layer 330 may have a thickness which is greater than about 15 nm. In one or more embodiments, the dielectric layer 330 may have a thickness which is greater than about 20 nm.

The dielectric layer 330 may be formed of any dielectric material. In one or more embodiments, the dielectric layer 330 may comprise an oxide, a nitride, an oxynitride, an imide or combinations thereof. In one or more embodiments, the dielectric layer 330 may comprise a high-K dielectric material. The dielectric material may have a dielectric constant greater than silicon dioxide. The high-K material may have a dielectric constant greater than 3.9.

Referring to FIG. 9C, another dielectric layer 210 may be deposited over the dielectric layer 330. The possible materials for the dielectric layer 210 have been described above and are applicable here. For example, the dielectric layer 210 may comprise, for example, an oxide, a nitride, an oxynitride, an imide or combinations thereof. In one or more embodiments, the dielectric layer 210 may be formed of a different material from dielectric layer 330. In one or more embodiments, the dielectric layer 210 may be formed of the same material as dielectric layer 330.

The possible thicknesses of dielectric layer 210 have been described above and that discussion is applicable here. For example, in one or more embodiments, the thickness of dielectric layer 210 may be greater than about 250 nm. In one or more embodiments, the thickness of dielectric layer 210 may be greater than about 500 nm. In one or more embodiments, the thickness of dielectric layer 210 may be greater than about 750 nm. In one or more embodiments, the thickness of dielectric layer 210 may be greater than about 1000 nm. In one or more embodiments, the thickness of dielectric layer 210 may be greater than about 2000 nm. In one or more embodiments, the thickness of dielectric layer 210 may be greater than about 5000 nm. In one or more embodiments, the thickness of the dielectric layer 210 may be greater than about 10000 nm (10 microns). In one or more embodiments, the thickness of layer dielectric 210 may be greater than about 15000 nm (15 microns). In one or more embodiments, the thickness of dielectric layer 210 may be greater than about 20000 nm (20 microns). In one or more embodiments, the thickness of dielectric layer 210 may be less than about 20000 nm (20 microns). The thickness corresponds to the height H2 shown in FIG. 9C.

In one or more embodiments, the thickness of the dielectric layer 210 may be greater than the thickness of dielectric layer 330. In one or more embodiments, the thickness of the dielectric layer 210 may be greater than about five times the thickness of dielectric layer 330. In one or more embodiments, the thickness of dielectric layer 210 may be greater than about ten times the thickness of dielectric layer 330. In one or more embodiments, the thickness of dielectric layer 210 may be greater than about 15 times the thickness of dielectric layer 330. In one or more embodiments, the thickness of dielectric layer 210 may be greater than about 20 times the thickness of dielectric layer 330. In one or more embodiments, the thickness of dielectric layer 210 may be greater than about 25 times the thickness of dielectric layer 330. In one or more embodiments, the thickness of dielectric layer 210 may be greater than about 50 times the thickness of dielectric layer 330. In one or more embodiments, the thickness of dielectric layer 210 may be greater than about 100 times the thickness of dielectric layer 330.

Openings 340A and 340B may be formed over the first final metal line 130A and the second final metal line 130B, respectively. In one embodiment, the opening 340A may first be formed through the opening 340A and stopped on the layer 330. Then the opening 340B may be formed through the layer 210, through the layer 330 and stopped on the metal line 130B. In another embodiment, in a first step, openings 340A and 340B may both be formed through the dielectric layer 210 and stopped on the dielectric layer 330. In a second step, opening 340B may then be continued through the dielectric layer 330 (this may be done, for example, with the use of a resist mask and a wet or dry etch process). The opening 340B may expose a top surface of the second final metal line 130B. It is noted that, in one or more embodiments, the opening 340A may be formed over a bonding or contact pad of first final metal line 130A. Likewise, in one or more embodiments, the opening 340B may be formed over a bonding or contact pad of second final metal line 130B. The height of the opening 340A may correspond to the thickness of the dielectric layer 210 over the first final metal line 130A. The height H2 of the opening 340A corresponds to the thickness of the dielectric layer 210.

Referring to FIG. 9D, a redistribution layer 230 may then be formed in the openings 340A and 340B. The redistribution layer 230 includes a first conductive pathway 230A and a second conductive pathway 230B. The first conductive pathway 230A includes at least a portion 232A that is formed within the opening 340A. The second conductive pathway 230B that include at least a portion 232B that is formed within the opening 340B.

The possible materials of the redistribution layer 230 have been discussed above and that discussion is applicable here. For example, in one or more embodiments, the redistribution layer 230 may be formed of a conductive material. In one or more embodiments, the redistribution layer 230 may be formed of a metallic material.

At least the portion 232A forms a top conductive plate for a capacitor while at least a portion of first final metal line 130A forms a bottom conductive plate for the capacitor. The dielectric layer 330 forms the dielectric or insulator material for the capacitor. In one or more embodiments, the capacitor may be an MIM (metal-insulator-metal) capacitor.

As has been discussed above, in one or more embodiments, the first conductive pathway 230A may be electrically insulated from second conductive pathway 230B. In one or more embodiments, the first conductive pathway 230A, may be electrically coupled to a voltage source or to a ground. In one or more embodiments, the first conductive pathway 230A may be floating. In one or more embodiments, the first conductive pathway 230A may be electrically coupled to another conductive pathway. In one or more embodiments, the first conductive pathway 230A may be electrically coupled to the second conductive pathway 230B. In this embodiment, the first final metal line 130A may be electrically coupled to a device in the substrate. Likewise, the second final metal line 130B may also be coupled to the same or different device in the substrate. Hence, by electrically coupling the first conductive pathway 230A to the second conductive pathway 230B, it is a way to electrically couple both of the capacitor plates of the capacitor to a device or to devices formed in the substrate.

Figure 10A:
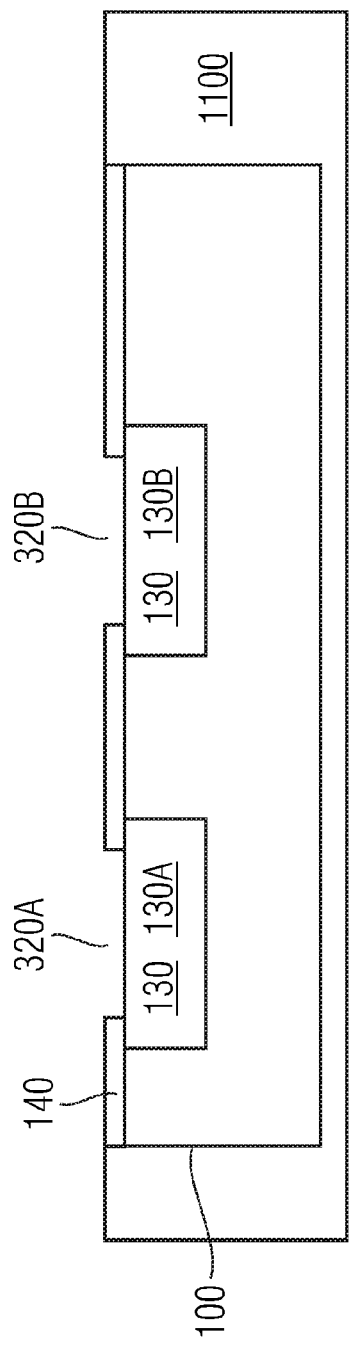

FIG. 10D shows another embodiment of a semiconductor device. FIGS. 10A through 10D show an embodiment of a method of manufacturing the device shown in FIG. 10D. Referring to FIG. 10A, semiconductor chip 100 is embedded in a support structure 1100. The support structure 1100 may be a mold compound. The semiconductor chip 100 includes a final metal layer 130 that includes a first final metal line 130A and a second final metal line 130B. The chip 100 further includes a passivation layer 140. Possible materials and thickness of the passivation layer 140 have been discussed and that discussion is applicable here. As noted above, the passivation layer 140 may, for example, comprise one or more dielectric layers such as oxides, nitrides, imides or combinations thereof.

Openings 320A and 320B are formed through the passivation layer 140 over the first final metal line 130A and the second final metal line 130B, respectively. In one or more embodiments, the opening 320A may be formed over a bonding or contact pad of the first final metal line 130A. In one or more embodiments, the opening 320B may be formed over a bonding or contact pad of the second final metal line 130B.

Figure 10B:
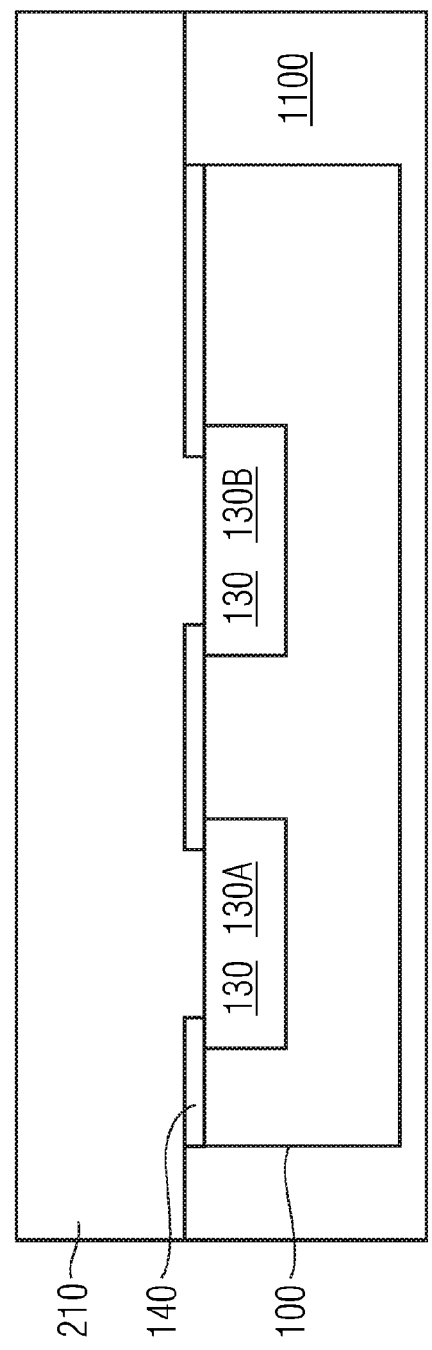

Referring to FIG. 10B, a dielectric layer 210 may then be deposited over the passivation layer 140 and over the exposed first and second final metal lines 130A, 130B. The possible materials of the dielectric layer 210 have been discussed above and that discussion is applicable here. For example, the dielectric layer 210 may comprise, for example, an oxide, a nitride, an oxynitride, an imide or combinations thereof.

In one or more embodiments, the thickness of dielectric layer 210 may be greater than about 250 nm (nanometers). In one or more embodiments, the thickness of dielectric layer 210 may be greater than about 500 nm. In one or more embodiments, the thickness of dielectric layer 210 may be greater than about 750 nm. In one or more embodiments, the thickness of dielectric layer 210 may be greater than about 1000 nm. In one or more embodiments, the thickness of dielectric layer 210 may be greater than about 2000 nm. In one or more embodiments, the thickness of dielectric layer 210 may be greater than about 5000 nm. In one or more embodiments, the thickness of the dielectric layer 210 may be greater than about 10000 nm (10 microns). In one or more embodiments, the thickness of layer 210 may be greater than about 15000 nm (15 μm, where μm is an abbreviation for micron). In one or more embodiments, the thickness of layer 210 may be greater than about 20000 nm (20 μm). In one or more embodiments, the thickness of layer 210 may be less than about 20000 nm (20 μm). The thickness of the dielectric layer 210 is shown in FIG. 10C as the height H3.

Referring to FIG. 10C, openings 340A, 340B are then formed through the dielectric layer 210 over the first final metal line 130A and the second final metal line 130B so as to expose the first metal line 130A and the second final metal line 130B. The height H3 of the opening 340A corresponds to the thickness H3 of the dielectric layer 210.

Referring to FIG. 10D, a dielectric layer 430 is then deposited over the dielectric layer 210, into the openings 340A, 340B as well as over the final metal lines 130A, 130B. The deposition may be an essentially conformal deposition. The dielectric layer 430 may be removed from the top surface of the second final metal line 130B within the opening 340B. This may be done with the use of a resist mask and a wet or dry etch process.

The dielectric layer 430 may be formed of any dielectric material. For example, the dielectric layer may comprise an oxide, a nitride, an oxynitride, an imide, or combinations thereof. In one or more embodiments, the dielectric layer 430 may comprise a high-K material. The dielectric layer 430 may be formed of the same dielectric materials as dielectric layer 330 described above.

In one or more embodiments, the dielectric layer 430 may have a thickness less than about 500 nm. In one or more embodiments, the dielectric layer 430 may have a thickness less than about 250 nm. In one or more embodiments, the dielectric layer 430 may have a thickness less than about 200 nm. In one or more embodiments, the dielectric layer 430 may have a thickness less than about 150 nm. In one or more embodiments, the dielectric layer 430 may have a thickness less than about 100 nm. In one or more embodiments, the dielectric layer 430 may have a thickness which is less than about 50 nm. In one or more embodiments, the dielectric layer 430 may have a thickness which is less than about 25 nm. In one or more embodiments, the dielectric layer 430 may have a thickness which is less than about 20 nm. In one or more embodiments, the dielectric layer 430 may have a thickness which is less than about 15 nm. In one or more embodiments, the dielectric layer 430 may have a thickness which is less than about 10 nm. In one or more embodiments, the dielectric layer 430 may have a thickness greater than about 10 nm. In one or more embodiments, the dielectric layer 430 may have a thickness which is greater than about 20 nm.

In one or more embodiments, the thickness H3 of the dielectric layer 210 may be greater than the thickness of dielectric layer 430. In one or more embodiments, the thickness H3 of the dielectric layer 210 may be greater than about five times the thickness of dielectric layer 430. In one or more embodiments, the thickness H3 of dielectric layer 210 may be greater than about ten times the thickness of dielectric layer 430. In one or more embodiments, the thickness H3 of dielectric layer 210 may be greater than about 15 times the thickness of dielectric layer 430. In one or more embodiments, the thickness H3 of dielectric layer 210 may be greater than about 20 times the thickness of dielectric layer 430. In one or more embodiments, the thickness H3 of dielectric layer 210 may be greater than about 25 times the thickness of dielectric layer 430. In one or more embodiments, the thickness H3 of dielectric layer 210 may be greater than about 50 times the thickness of dielectric layer 430. In one or more embodiments, the thickness H3 of dielectric layer 210 may be greater than about 100 times the thickness of dielectric layer 430.

A redistribution layer 230 may then be formed in the openings 340A and 340B. The possible materials of redistribution layer have been discussed and that discussion is applicable here. For example, in one or more embodiments, the redistribution layer 230 may be formed of a conductive material. In one or more embodiments, the redistribution layer may be formed of a metallic material. The redistribution layer 230 includes a first conductive pathway 230A having at least a portion 232A formed in the opening 340A. The redistribution layer 230 includes a second conductive pathway 230B having at least a portion 232B disposed within the opening 340B. The portion 232A of the first conductive pathway 230A is disposed over the dielectric layer 430 within the opening 340A. The portion 232B of the second conductive pathway 230B is disposed so as to be electrically coupled to the second final metal line 130B within the opening 340B. In the embodiment shown, the portion 232B is disposed over and in contact with the second final metal line 130B.

In the structure shown in FIG. 10D, at least the portion 232A forms a first conductive plate (for example, a top metal plate) for a capacitor, and at least a portion of the first final metal line 130A forms a second conductive plate (for example, a bottom plate) for the same capacitor. The dielectric layer 530 between the top plate and bottom plate forms the insulation layer for the capacitor. If the redistribution layer is formed of a metallic material, then the capacitor formed may be referred to as a metal-insulator-metal or MIM capacitor.

As discussed, the redistribution layer 230 may serve to redistribute electrical signals or electrical energy. The metal redistribution layer may, for example be useful in distributing electrical signals or electrical energy to other portions of the semiconductor device. The electrical signals may be in the form of electrical current or voltage. For example, electrical signals may be redistributed to other positions that overlie the semiconductor chip. In addition, the redistribution layer may also redistribute the electrical signals to positions that do not overlie the chip but instead to positions which are outside the lateral boundary or lateral border of the chip. In one or more embodiments of the invention, conductive balls (such as solder balls) may be electrically coupled to the ends of the conductive pathways. The conductive balls may be used to couple to the structure to, for example, a printed circuit board. In one or more embodiments, the resulting semiconductor devices may be formed as a wafer level ball package.

Figure 11:
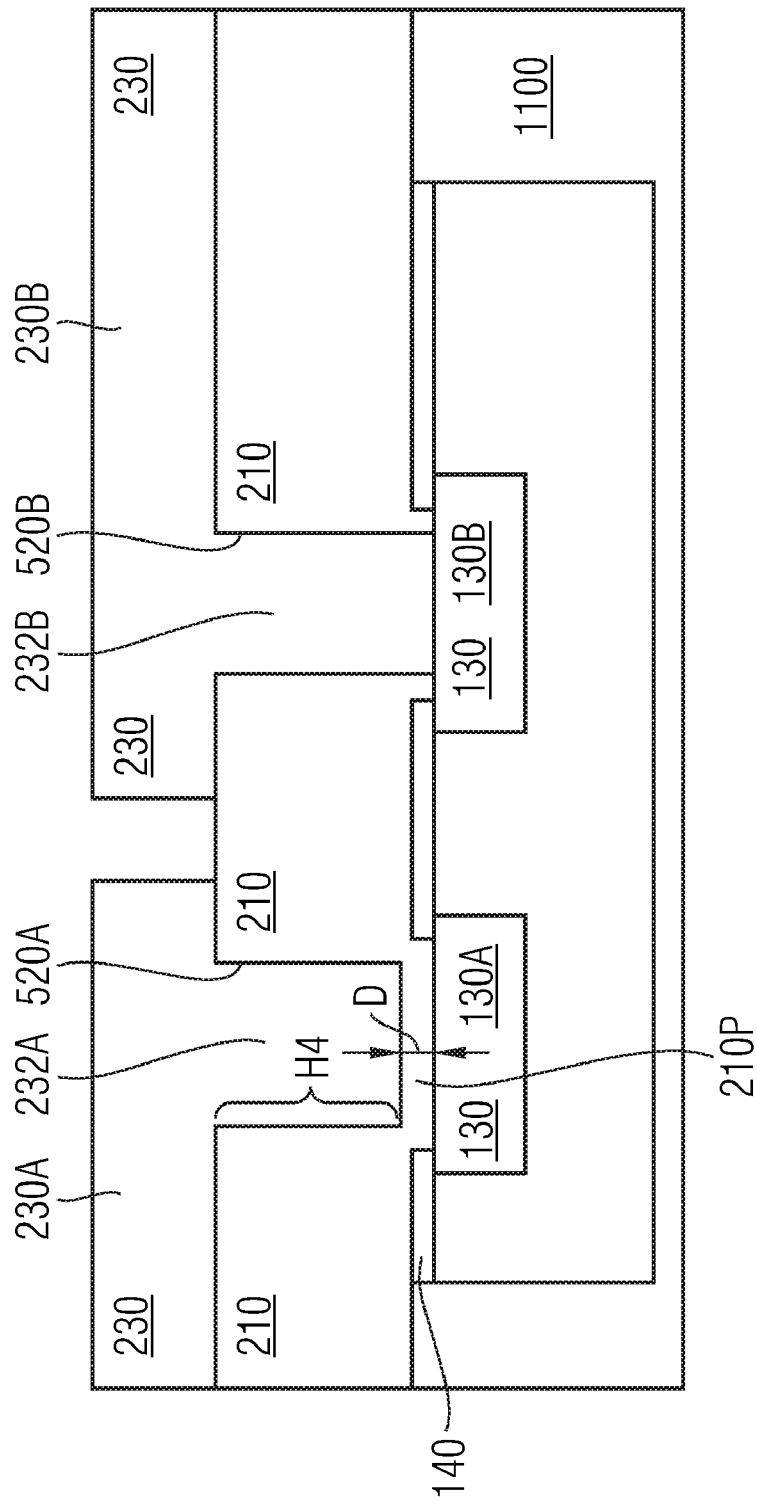
FIG. 11 shows an embodiment of a semiconductor structure.

Another embodiment of the invention is shown in FIG. 11. In the structure shown in FIG. 11, the dielectric layer 430 from FIG. 10D has been removed. In the embodiment of FIG. 11, an opening 520A and an opening 520B are formed in the dielectric layer 210. In this embodiment, the opening 520A does not go completely through the dielectric layer 210. Instead, it shops short by a distance D. The portion of the dielectric layer 210 that is not etched is shown as portion 210P of dielectric layer 210.

In one or more embodiments the distance D may be less than about 250 nm. In one or more embodiments the distance D may be less than about 200 nm. In one or more embodiments the distance D may be less than about 150 nm. In one or more embodiments the distance D may be less than about 100 nm. In one or more embodiments the distance D may be less than about 50 nm. In one or more embodiments the distance D may be less than about 25 nm. In one or more embodiments the distance D may be less than about 20 nm. In one or more embodiments, the distance D may be less than about 15 nm. In one or more embodiments the distance D may be less than about 10 nm. In the embodiment shown, the opening 520B goes all the way through the dielectric layer 210. The possible materials and thicknesses for the passivation layer 140 were discussed above and that discussion is applicable here. Likewise, the possible materials and thickness for the dielectric layer 210 were discussed above and that discussion is applicable here.

In one or more embodiments, the height H4 of opening 520A may be greater than about 250 nm. In one or more embodiments, the height H4 of the opening 520A may be greater than about 500 nm. In one or more embodiments, the height H4 of the opening 520A may be greater than about 750 nm. In one or more embodiments, the height H of the opening 520A may be greater than about 1000 nm. In one or more embodiments, the height H4 of the opening 520A may be greater than about 2000 nm. In one or more embodiments, the height H4 of the opening 520A may be greater than about 5000 nm. In one or more embodiments, the height H4 of the opening 520A may be greater than about 10000 nm (10 μm). In one or more embodiments, the height H4 of the opening 520A may be greater than about 15000 nm (15 μm). In one or more embodiments, the height H4 of the opening 520A may be greater than about 20000 nm (20 μm). In one or more embodiments, the height H4 of the opening 520A may be less than about 20000 nm (20 μm).

In one or more embodiments, the height H4 may be greater than the thickness D. In one or more embodiments, the height H4 may be greater than about five times the thickness D. In one or more embodiments, the height H4 may be greater than about ten times the thickness D. In one or more embodiments, the height H4 may be greater than about 15 times the thickness D. In one or more embodiments, the height H4 may be greater than about 20 times the thickness D. In one or more embodiments, the height H may be greater than about 25 times the thickness D. In one or more embodiments, the height H4 may be greater than about 50 times the thickness D. In one or more embodiments, the height H4 may be greater than about 100 times the thickness D.

Referring to FIG. 11, a redistribution layer 230 may then be formed in the openings 520A and 520B. The redistribution layer 230 includes a first conductive pathway 230A and a second conductive pathway 230B. The first conductive pathway 230A includes at least a portion 232A that is formed within the opening 520A. The second conductive pathway 230B that include at least a portion 232B that is formed within the opening 520B.

The possible materials of the redistribution layer 230 have been discussed above and that discussion is applicable here. For example, in one or more embodiments, the redistribution layer 230 may be formed of a conductive material. In one or more embodiments, the redistribution layer 230 may be formed of a metallic material.

At least the portion 232A forms a top conductive plate for a capacitor while at least a portion of first final metal line 130A forms a bottom conductive plate for the capacitor. The portion 210P of dielectric layer 210 forms the dielectric layer for the capacitor. In one or more embodiments, the redistribution layer 230 may be formed of a metallic material. In such as case, the capacitor may be an MIM (metal-insulator-metal) capacitor.

As has been discussed above, in one or more embodiments, the first conductive pathway 230A may be electrically insulated from second conductive pathway 230B. In one or more embodiments, the first conductive pathway 230A, may be electrically coupled to a voltage source or to a ground. In one or more embodiments, the first conductive pathway 230A may be floating. In one or more embodiments, the first conductive pathway 230A may be electrically coupled to another conductive pathway. In one or more embodiments, the first conductive pathway 230A may be electrically coupled to the second conductive pathway 230B. In this embodiment, the first final metal line 130A may be electrically coupled to a device in the substrate. Likewise, the second final metal line 130B may also be coupled to the same or different device in the substrate. Hence, by electrically coupling the first conductive pathway 230A to the second conductive pathway 230B, it is a way to electrically couple both the capacitor plates of the capacitor to a device or to devices formed in the substrate.

In one or more of the embodiments described herein, a capacitor is formed during the processing steps that would normally be required to form a wafer level ball package. No extra processing steps may be required. The Q factor of a capacitor (such as a metal-insulator-metal or MIM capacitor) may be high since one or more of the layers used for the capacitor plates may be relatively thick.

The capacitance per unit area of the capacitors described herein is not limited to any particular value. In one or more embodiments, the capacitance per unit area may be about 0.1 $fF/\mu m^2$ or greater. In one or more embodiments, the capacitance per unit area may be about 0.2 $fF/\mu m^2$ or greater. In one or more embodiments, the capacitance per unit area may be about 0.5 $fF/\mu m^2$ or greater. In one or more embodiments, the capacitance per unit area may be about 0.75 $fF/\mu m^2$ or greater. In one or more embodiments, the capacitance per unit area may be about 1.0 $fF/\mu m^2$ or greater. In one or more embodiments, the capacitance per unit area may be about 2.0 $fF/\mu m^2$ or greater. In one or more embodiments, the capacitance per unit area may be about 10 $fF/\mu m^2$ or greater. In one or more embodiments, the capacitance per unit area may be about 20 $fF/\mu m^2$ or greater. In one or more embodiments, the capacitance per unit area may be about 40 $fF/\mu m^2$ or greater. It is noted that fF is an abbreviation for femtofarad, nm is an abbreviation for nanometer, and μm is an abbreviation for micron.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

What is claimed is:

1. A semiconductor structure, comprising:
   a semiconductor chip including a final metal layer, said final metal layer including at least a first portion;
   a dielectric layer disposed over said final metal layer; and
   a conductive layer deposed over said dielectric layer, said conductive layer including at least a first portion, said first portionof said conductive layer overlying said first portion of said final metal layer, said dielectric layer being between said first portion of said final metal layer and said first portion of said conductive layer, said first portion of said conductive layer electrically isolated from said first portion of said final metal layer, said dielectric layer having a thickness less than about 500 nm between said first portion of said final metal layer and said first portion of said conductive layer.

2. The structure of claim 1, wherein said dielectric layer has a thickness of less than about 250 nm between said first portion of said final metal layer and said first portion of said conductive layer.

3. The structure of claim 1, wherein said conductive layer comprises a metallic material.

4. The structure of claim 1, wherein said conductive layer is a redistribution layer.

5. The structure of claim 1, wherein a part of said conductive layer extends laterally outside the lateral boundary of said chip.

6. The structure of claim 1, wherein said semiconductor chip is at least partially embedded within a support.

7. The structure of claim 1, wherein said dielectric layer has a thickness of less than about 200 nm between said first portion of said final metal layer and said first portion of said conductive layer.

8. The structure of claim 1, wherein the dielectric layer has a thickness less than about 150 nm.

9. The structure of claim 1, wherein the dielectric layer has a thickness less than about 100 nm.

10. The structure of claim 1, wherein said final metal layer includes a second portion electrically isolated from said first portion of said final metal layer.

11. The structure of claim 1, wherein said conductive layer includes a second portion electrically isolated from said first portion of said conductive layer.

12. The structure of claim 10, wherein said first portion of said conductive layer is electrically coupled to said second portion of said final metal layer.

13. The structure of claim 10, wherein said conductive layer includes a second portion electrically isolated from said first portion of said conductive layer, said second portion of said conductive layer being electrically coupled to said second portion of said final metal layer.

14. The structure of claim 1, wherein said first portion of said final metal layer, said dielectric layer and said first portion of said conductive layer form a capacitor.

15. The structure of claim 1, wherein said dielectric layer is a part of said semiconductor chip.

16. A semiconductor structure, comprising:
   a semiconductor chip including a final metal layer, said final metal layer comprising at least a first final metal line;

a redistribution layer comprising at least a first conductive pathway, said first conductive pathway disposed over said first final metal line; and a dielectric layer disposed between said first final metal line and said first conductive pathway, said first conductive pathway electrically isolated from said first final metal line, said dielectric layer having a thickness less than about 500 nm.

17. The structure of claim 16, wherein said final metal layer comprises a second final metal line, said second final metal line being electrically isolated from said first final metal line, said first conductive pathway electrically coupled to said second final metal line.

18. The structure of claim 16, further comprising a support, said chip being at least partially embedded within said support.

19. The structure of claim 16, wherein said structure has a fan-out region.

20. The structure of claim 16, wherein said dielectric layer has a thickness less than about 250 nm.

21. The structure of claim 16, wherein said redistribution layer comprises a metallic material.

22. The structure of claim 16, wherein said first final metal line, said first conductive pathway and said dielectric layer form a capacitor. conductive material is a metallic material.

23. The structure of claim 16, wherein the dielectric layer has a thickness less than about 200 nm.

24. The structure of claim 16, wherein the dielectric layer has a thickness less than about 150 nm.

25. The structure of claim 16, wherein said redistribution layer comprises a second conductive pathway electrically isolated from said first conductive pathway.

26. The structure of claim 25, wherein final metal layer comprises a second final metal line, said second final metal line electrically coupled to said second conductive pathway.

27. The structure of claim 26, wherein said second final metal line is electrically isolated from said first final metal line.

28. The structure of claim 16, wherein said first final metal, line includes a pad, said first conductive pathway disposed over said pad.

29. A semiconductor structure, comprising:
a semiconductor chip including a final metal layer, said final metal layer comprising at least a first portion;
a first dielectric layer having an opening, at least a portion of said opening overlying said first portion of said final metal layer;
a second dielectric layer disposed over a bottom surface of said opening, said second dielectric layer overlying said first portion of said final metal layer; and
a conductive material disposed within said opening, said conductive material overlying said second dielectric layer and said first portion of said final metal layer, said conductive material electrically isolated from said first portion of said final metal layer, said second dielectric layer having a thickness less than about 500 nm.

30. The structure of claim 29, wherein said second dielectric layer has a thickness less than about 250 nm.

31. The structure of claim 29, wherein first dielectric layer and said second dielectric layer are part of the same dielectric layer, said opening being a recess in said same dielectric layer.

32. The structure of claim 29, wherein said conductive material is a metallic material.

33. The structure of claim 29, wherein the second dielectric layer has a thicknesss less than about 200 nm.

34. The structure of claim 29, wherein the second dielectric layer has a thickness less than about 150 nm.

35. The structure of claim 29, wherein said final metal layer. comprises a second portion electrically isolated from said first portion.

36. The structure of claim 35, wherein said conductive material is electrically coupled to said second portion of said final metal layer.

37. A semiconductor structure, comprising:
a semiconductor chip including a final metal layer, said final metal layer including at least a first portion;
a conductive layer including at least a first portion, said first portion of said conductive layer overlying and electrically isolated from said first portion of said final metal layer; and
a dielectric layer between said first portion of said final metal layer and said first portion of said conductive layer, said dielectric layer having a thickness less than about 500 nm.

38. The structure of claim 37, wherein said dielectric layer has a thickness of less than about 250 nm.

39. The structure of claim 37, wherein said dielectric layer has a thickness of less than 200 nm.

40. The structure of claim 37, wherein said dielectric layer has a thickness of less than 150 nm.

41. The structure of claim 37, wherein said dielectric layer has a thickness of less than 100 nm.

42. The structure of claim 37, wherein said conductive layer comprises a metallic material.

43. The structure of claim 37, wherein said conductive layer is a redistribution layer.

44. The structure of claim 37, wherein said dielectric layer is a part of said semiconductor chip.

45. The structure of claim 37, wherein a part of said conductive layer extends laterally outside the lateral boundary of said semiconductor chip.

46. The structure of claim 37, wherein said semiconductor chip is at least partially embedded within a support.

47. The structure of claim 37, wherein said final metal layer comprises a second portion electrically isolated from said first portion of said final metal layer.

48. The structure of claim 47, wherein said first portion of said conductive layer is electrically coupled to said second portion of said final metal layer.

49. The structure of claim 47, wherein said conductive layer comprises a second portion electrically isolated from said first portion of said conductive layer, said second portion of said conductive layer overlying and electrically coupled to said second portion of said final metal layer.

50. The structure of claim 37, wherein said first portion of said final metal line, said dielectric layer and said first portion of said conductive layer form a capacitor.

51. The structure of claim 37, wherein said first portion of said final metal layer and said first portion of said conductive layer are in direct contact with said dielectric layer.

52. The structure of claim 37, wherein said final metal layer comprises a metallic material.

* * * * *